(12) United States Patent
Makinouchi

(10) Patent No.: US 8,208,128 B2
(45) Date of Patent: Jun. 26, 2012

(54) POSITION MEASURING SYSTEM AND POSITION MEASURING METHOD, MOVABLE BODY APPARATUS, MOVABLE BODY DRIVE METHOD, EXPOSURE APPARATUS AND EXPOSURE METHOD, PATTERN FORMING APPARATUS, AND DEVICE MANUFACTURING METHOD

(75) Inventor: Susumu Makinouchi, Zama (JP)

(73) Assignee: Nikon Corporation, Tokyo (JP)

( * ) Notice: Subject to any disclaimer, the term of this patent is extended or adjusted under 35 U.S.C. 154(b) by 667 days.

(21) Appl. No.: 12/366,934

(22) Filed: Feb. 6, 2009

(65) Prior Publication Data
US 2009/0262321 A1   Oct. 22, 2009

Related U.S. Application Data

(60) Provisional application No. 61/064,173, filed on Feb. 20, 2008.

(30) Foreign Application Priority Data

Feb. 8, 2008   (JP) ................................ 2008-028288

(51) Int. Cl.
G01B 11/00   (2006.01)
G03B 27/32   (2006.01)
G03B 27/42   (2006.01)
G03B 27/58   (2006.01)
G03B 27/62   (2006.01)

(52) U.S. Cl. ........... 355/72; 310/12.06; 355/53; 355/75; 355/77; 356/400; 356/401

(58) Field of Classification Search ............... 250/492.2, 250/559.29–559.3; 310/12.05–12.06, 12.19; 318/649; 355/53, 67–68, 72, 75, 77; 356/399–401, 356/498–500, 614–616
See application file for complete search history.

(56) References Cited

U.S. PATENT DOCUMENTS 5,334,892 A * 8/1994 Chitayat ................... 310/12.06
5,493,403 A   2/1996 Nishi
5,579,111 A   11/1996 Maeda
5,969,441 A   10/1999 Loopstra et al.
(Continued)

FOREIGN PATENT DOCUMENTS
EP   1 420 298 A2   5/2004
(Continued)

OTHER PUBLICATIONS

Mar. 10, 2009 Written Opinion of the International Searching Authority issued in International Application No. PCT/JP2009/000460 (with translation).

*Primary Examiner* — Hung Henry Nguyen
*Assistant Examiner* — Colin Kreutzer
(74) *Attorney, Agent, or Firm* — Oliff & Berridge, PLC

(57) ABSTRACT

A mirror block on which moving gratings are arranged is fixed to the lower surface of a stage. Fixed gratings are placed on the upper surface of a stage platform that is opposed to the lower surface of the stage. A Y encoder that measures Y positional information of the stage is configured including the moving gratings and the fixed gratings. Similarly, an X encoder that measures X positional information of the stage is configured including the moving gratings and the fixed grating.

66 Claims, 10 Drawing Sheets

U.S. PATENT DOCUMENTS

| | | | |
|---|---|---|---|
| 6,005,667 A | 12/1999 | Takamiya et al. | |
| 6,208,407 B1 | 3/2001 | Loopstra | |
| 6,590,634 B1 | 7/2003 | Nishi et al. | |
| 6,611,316 B2 | 8/2003 | Sewell | |
| 6,778,257 B2 | 8/2004 | Bleeker et al. | |
| 6,952,253 B2 | 10/2005 | Lof et al. | |
| 7,023,610 B2 | 4/2006 | Ohtsuki et al. | |
| 7,102,729 B2 | 9/2006 | Renkens et al. | |
| 7,256,871 B2 | 8/2007 | Loopstra et al. | |
| 7,289,212 B2 | 10/2007 | Kwan | |
| 7,292,312 B2 | 11/2007 | Loopstra et al. | |
| 7,362,446 B2 | 4/2008 | Van Der Pasch et al. | |
| 7,408,655 B2 | 8/2008 | Loopstra et al. | |
| 2002/0085210 A1 | 7/2002 | Takayama et al. | |
| 2003/0025890 A1 | 2/2003 | Nishinaga | |
| 2005/0128461 A1 | 6/2005 | Beems et al. | |
| 2006/0023178 A1* | 2/2006 | Loopstra et al. | 355/53 |
| 2007/0263191 A1 | 11/2007 | Shibazaki | |
| 2007/0263197 A1 | 11/2007 | Luttikhuis et al. | |
| 2007/0288121 A1 | 12/2007 | Shibazaki | |
| 2008/0074681 A1 | 3/2008 | Loopstra et al. | |
| 2009/0135388 A1 | 5/2009 | Makinouchi et al. | |
| 2010/0297561 A1* | 11/2010 | Beerens et al. | 430/322 |

FOREIGN PATENT DOCUMENTS

| | | |
|---|---|---|
| JP | A-63-231217 | 9/1988 |
| JP | A-10-38517 | 2/1998 |
| JP | A-11-72356 | 3/1999 |
| JP | A-2004-101362 | 4/2004 |
| JP | A-2004-289126 | 10/2004 |
| JP | A-2005-229091 | 8/2005 |
| WO | WO 99/49504 A1 | 9/1999 |
| WO | WO 2004/055803 A1 | 7/2004 |
| WO | WO 2005/074014 A1 | 8/2005 |
| WO | WO 2007/142351 A1 | 12/2007 |

* cited by examiner

POSITION MEASURING SYSTEM AND POSITION MEASURING METHOD, MOVABLE BODY APPARATUS, MOVABLE BODY DRIVE METHOD, EXPOSURE APPARATUS AND EXPOSURE METHOD, PATTERN FORMING APPARATUS, AND DEVICE MANUFACTURING METHOD

CROSS-REFERENCE TO RELATED APPLICATIONS

This non-provisional application claims the benefit of Provisional Application No. 61/064,173 filed Feb. 20, 2008, the disclosure of which is hereby incorporated herein by reference in its entirety.

BACKGROUND OF THE INVENTION

1. Field of the Invention

The present invention relates to position measuring systems and position measuring methods, movable body apparatuses, movable body drive methods, exposure apparatuses and exposure methods, pattern forming apparatuses, and device manufacturing methods, and more particularly, to a position measuring system and a position measuring method to measure positional information of a movable body that moves along a predetermined plane, a movable body apparatus that is equipped with the position measuring system, a movable body drive method that uses the position measuring method, and an exposure apparatus and a pattern forming apparatus that are equipped with the movable body apparatus, an exposure method that uses the movable body drive method, and a device manufacturing method that uses the exposure apparatus, the pattern forming apparatus, or the exposure method.

2. Description of the Background Art

Conventionally, in a lithography process for manufacturing electron devices (microdevices) such as semiconductor devices (such as integrate circuits) and liquid crystal display devices, an exposure apparatus such as a reduction projection exposure apparatus by a step-and-repeat method (a so-called stepper) or a reduction projection exposure apparatus by a step-and-scan method (a so-called scanning stepper (which is also called a scanner)) are mainly used.

In this type of exposure apparatus, in order to transfer a pattern of a reticle (or a mask) via a projection optical system onto a plurality of shot areas on an object to be exposed such as a wafer or a glass plate (hereinafter, generically referred to as a wafer), a wafer stage that holds the wafer is driven in two-dimensional directions by, for example, a linear motor or the like. In particular, in the scanning stepper, not only the wafer stage but also a reticle stage is also driven in a scanning direction with a predetermined stroke by a linear motor or the like.

In general, positional information of the wafer stage and the like is measured with a laser interferometer that has high stability for over a long period. However, due to finer patterns accompanying higher integration of semiconductor devices in recent years, the position control performance of the wafer stage with higher precision has been required, and therefore, measurement error of the laser interferometer caused by air fluctuations generated due to the temperature variation or the temperature gradient in the atmosphere in the beam path has become unignorable.

Accordingly, an encoder that is hard to be affected by air fluctuations compared with the laser interferometer has begun to be employed as a position measuring device of the stage (e.g. refer to Kokai (Japanese Unexamined Patent Application Publication) No. 2004-101362). However, in the case of employing the encoder described in Kokai (Japanese Unexamined Patent Application Publication) No. 2004-101362 as the position measuring device of the wafer stage, a linear scale had to be installed at a position that is away from the center of gravity of the stage. Therefore, it was difficult to accurately perform servo control in stage drive, and also a measurement axis was apart from a working point of a wafer, e.g. from the exposure center (an optical axis of the projection optical system) in the case of a projection exposure apparatus, and consequently it was difficult to perform the high-precision process of the wafer, e.g. an exposure process due to Abbe error generated by rotation/inclination of the wafer stage.

SUMMARY OF THE INVENTION

According to a first aspect of the present invention, there is provided a first position measuring system that measures positional information of a movable body that moves along a predetermined plane including a first axis and a second axis that are orthogonal to each other, the system comprising: a first fixed grating and a second fixed grating that are respectively arranged external to the movable body so as to extend in a direction parallel to the first axis, the first fixed grating having its periodic direction in the direction parallel to the first axis and the second fixed grating having its periodic direction in a direction parallel to the second axis; an optical member that has a first moving grating and a second moving grating and is attached to the movable body, the first and second moving gratings having their periodic directions in directions corresponding to the periodic directions of the first fixed grating and the second fixed grating respectively; and a first photodetection system and a second photodetection system that correspond to the first and second fixed gratings respectively, whereby a first measurement device that measures positional information of the movable body in the direction parallel to the first axis is configured including the first fixed grating, the first moving grating and the first photodetection system, and a second measurement device that measures positional information of the movable body in the direction parallel to the second axis is configured including the second fixed grating, the second moving grating and the second photodetection system.

With this system, in the first measurement device, a measurement beam is irradiated along the optical path parallel to the first axis to the first moving grating which the optical member attached to the movable body has, a diffraction beam generated from the first moving grating is irradiated to the first fixed grating that is arranged extending in the direction parallel to the first axis external to the movable body and has its periodic direction in the direction parallel to the first axis, and a diffraction beam generated from the first fixed grating is received with the first photodetection system via the optical member, and thereby positional information of the movable body in the direction parallel to the first axis is measured. And, in the second measurement device, a measurement beam is irradiated along the optical path parallel to the first axis to the second moving grating which the optical member attached to the movable body has, a diffraction beam generated from the second moving grating is irradiated to the second fixed grating that is arranged extending in the direction parallel to the first axis external to the movable body and has its periodic direction in the direction parallel to the second axis, and a diffraction beam generated from the second fixed grating is received with the second photodetection system via the optical member, and thereby positional information of the movable body in the direction parallel to the second axis is measured. In this case, the first fixed grating with the periodic direction in the direction parallel to the first axis can be placed on an axis that passes through a desired point and is parallel to the first axis, and therefore high-precision position measurement of the movable body in at least the direction parallel to the first axis becomes possible. Meanwhile, the optical member having the first and second moving gratings can be placed at an arbitrary position on the movable body, for example, can be placed on a straight line that passes through the center of gravity and is parallel to the second axis. Accordingly, it becomes possible to measure the position of the movable body near the center of gravity of the movable body in at least the direction parallel to the second axis.

According to a second aspect of the present invention, there is provided a first movable body apparatus, comprising: a movable body that moves along a predetermined plane including a first axis and a second axis that are orthogonal to each other; the first position measuring system of the present invention that measures positional information of the movable body within the predetermined plane; and a drive device that drives the movable body along the predetermined plane based on the positional information of the movable body that has been measured by the position measuring system.

With this apparatus, based on the positional information of the movable body in the directions parallel to the first axis and the second axis, respectively, which has been measured with high precision by the first position measuring system of the present invention, the drive device drives the movable body along the predetermined plane. Accordingly, high-precision drive of the movable body becomes possible.

According to a third aspect of the present invention, there is provided a second position measuring system that measures positional information of a movable body that moves along a predetermined plane including a first axis and a second axis that are orthogonal to each other, the system comprising: a first measurement device which includes a first reference grating that is arranged external to the movable body so as to extend in a direction parallel to the first axis and has its periodic direction in the direction parallel to the first axis, a first diffraction grating that is arranged on the movable body and has its periodic direction in a direction corresponding to the periodic direction of the first reference grating, and a first photodetection system that corresponds to the first reference grating, and which measures positional information of the movable body in the direction parallel to the first axis; and a second measurement device which includes a second reference grating that is arranged on the movable body and has its periodic direction in a direction parallel to the second axis, a second diffraction grating that is arranged external to the movable body so as to extend in the direction parallel to the first axis and has its periodic direction in a direction corresponding to the periodic direction of the second reference grating, and a second photodetection system that corresponds to the second reference grating, and which measures positional information of the movable body in the direction parallel to the second axis.

With this system, in the first measurement device, a measurement beam is irradiated along the optical path parallel to the first axis to the first diffraction grating arranged on the movable body, a diffraction beam generated from the first diffraction grating is irradiated to the first reference grating that is arranged extending in the direction parallel to the first axis external to the movable body and has its periodic direction in the direction parallel to the first axis, and a diffraction beam generated from the first reference grating is received by the first photodetection system, and thereby positional information of the movable body in the direction parallel to the first axis is measured. And, in the second measurement device, a measurement beam is irradiated along the optical path parallel to the first axis to the second reference grating that is arranged on the movable body and has its periodic direction in the direction parallel to the second axis, a diffraction beam generated from the second reference grating is irradiated to the second diffraction grating that is arranged extending in the direction parallel to the first axis external to the movable body and has its periodic direction in the direction parallel to the second axis, and a diffraction beam generated from the second diffraction grating is received by the second photodetection system, and thereby positional information of the movable body in the direction parallel to the second axis is measured. In this case, the first reference grating can be placed on an axis that passes through a desired point and is parallel to the first axis, and therefore high-precision position measurement of the movable body in at least the direction parallel to the first axis becomes possible. Meanwhile, the second reference grating can be placed at an arbitrary position on the movable body, for example, can be placed on a straight line that passes through the center of gravity and is parallel to the second axis. Accordingly, it becomes possible to measure the position of the movable body near the center of gravity of the movable body in at least the direction parallel to the second axis.

According to a fourth aspect of the present invention, there is provided a second movable body apparatus, comprising: a movable body that moves along a predetermined plane including a first axis and a second axis that are orthogonal to each other; the second position measuring system of the present invention that measures positional information of the movable body within the predetermined plane; and a drive device that drives the movable body along the predetermined plane based on the positional information of the movable body that has been measured by the position measuring system.

With this apparatus, based on the positional information of the movable body in the directions parallel to the first axis and the second axis, respectively, which has been measured with high precision by the second position measuring system of the present invention, the drive device drives the movable body along the predetermined plane. Accordingly, high-precision drive of the movable body becomes possible.

According to a fifth aspect of the present invention, there is provided a third position measuring system that measures positional information of a movable body that moves along a predetermined plane including a first axis and a second axis that are orthogonal to each other, the system comprising: a first measurement device which measures positional information of the movable body in a direction parallel to the first axis, by irradiating a first moving grating that is comprised in an optical member attached to the movable body, with a first measurement beam along an optical path that at least partially includes a first optical path parallel to the first axis, irradiating a first fixed grating that is arranged external to the movable body so as to extend in the direction parallel to the first axis and has its periodic direction in the direction parallel to the first axis with a diffraction beam generated from the first moving grating, and receiving a diffraction beam generated from the first fixed grating via the optical member; and a second measurement device which measures positional information of the movable body in a direction parallel to the second axis, by irradiating a second moving grating that is comprised in the optical member, with a second measurement beam along an optical path that at least partially includes a second optical path close to the first optical path and parallel to the first axis, irradiating a second fixed grating that is arranged external to the movable body so as to extend in the direction parallel to the first axis and has its periodic direction in the direction parallel to the second axis with a diffraction beam generated from the second moving grating, and receiving a diffraction beam generated from the second fixed grating via the optical member.

With this system, the first measurement device measures positional information of the movable body in the direction parallel to the first axis and the second measurement device measures positional information of the movable body in the direction parallel to the second axis. In this case, since the first fixed grating can be placed on an axis that passes through a desired point and is parallel to the first axis, high-precision position measurement of the movable body in at least the direction parallel to the first axis becomes possible. Meanwhile, the optical member on which the first and second moving gratings are arranged can be placed at an arbitrary position on the movable body, for example, can be placed on a straight line that passes through the center of gravity and is parallel to the second axis. Accordingly, it becomes possible to measure the position of the movable body near the center of gravity of the movable body in at least the direction parallel to the second axis. Further, because the first optical path and the second optical path are parallel and close to each other and also the first and second measurement beams are irradiated along the first and second optical paths to the common optical member fixed to the movable body, it becomes possible to make the measurement points of position measurement of the movable body in the directions parallel to the first axis and the second axis be in proximity.

According to a sixth aspect of the present invention, there is provided a third movable body apparatus, comprising: a movable body that moves along a predetermined plane including a first axis and a second axis that are orthogonal to each other; the third position measuring system of the present invention that measures positional information of the movable body within the predetermined plane; and a drive device that drives the movable body along the predetermined plane based on the positional information of the movable body that has been measured by the position measuring system.

With this apparatus, based on the positional information of the movable body in the directions parallel to the first axis and the second axis, respectively, which has been measured with high precision by the third position measuring system of the present invention, the drive device drives the movable body along the predetermined plane. Accordingly, high-precision drive of the movable body becomes possible.

According to a seventh aspect of the present invention, there is provided an exposure apparatus that forms a pattern on an object by irradiating the object with an energy beam, the apparatus comprising: any one of the first, second and third movable body apparatuses of the present invention that drives a movable body that holds the object along a predetermined plane in order to form the pattern.

With this apparatus, in order to form a pattern on the object by irradiating the object with the energy beam, any one of the first, second and third movable body apparatuses of the present invention drives the movable body that holds the object, along the predetermined plane. Accordingly, it becomes possible to form the pattern on the object with high precision.

According to an eighth aspect of the present invention, there is provided a first device manufacturing method, comprising: a process of forming a pattern on an object by using the exposure apparatus of the present invention; and a process of applying processing to the object on which the pattern has been formed.

According to a ninth aspect of the present invention, there is provided a pattern forming apparatus that forms a pattern on an object, the apparatus comprising: a movable body that can move while holding the object; a pattern generating device that forms the pattern on the object; and any one of the first, second and third movable body apparatuses of the present invention that drives the movable body along a predetermined plane.

With this apparatus, in order to form a pattern on the object, any one of the first, second and third movable body apparatuses of the present invention drives the movable body that holds the object, along the predetermined plane. Accordingly, it becomes possible to form the pattern on the object with high precision.

According to a tenth aspect of the present invention, there is provided a second device manufacturing method, comprising: a process of forming a pattern on an object by using the pattern forming apparatus of the present invention; and a process of applying processing to the object on which the pattern has been formed.

According to an eleventh aspect of the present invention, there is provided a first position measuring method of measuring positional information of a movable body that moves along a predetermined plane including a first axis and a second axis that are orthogonal to each other, the method comprising: a first measurement process of measuring positional information of the movable body in a direction parallel to the first axis, by irradiating a first moving grating that is comprised in an optical member attached to the movable body and has its periodic direction in a direction corresponding to a periodic direction of a first fixed grating, with a first measurement beam along an optical path parallel to the first axis, irradiating the first fixed grating that is arranged external to the movable body so as to extend in the direction parallel to the first axis and has its periodic direction in the direction parallel to the first axis with a diffraction beam generated from the first moving grating, and receiving a diffraction beam generated from the first fixed grating, with a first photodetection system via the optical member; and a second measurement process of measuring positional information of the movable body in a direction parallel to the second axis, by irradiating a second moving grating that is comprised in the optical member and has its periodic direction in a direction corresponding to a periodic direction of a second fixed grating, with a second measurement beam along an optical path parallel to the first axis, irradiating the second fixed grating that is arranged external to the movable body so as to extend in the direction parallel to the first axis and has its periodic direction in the direction parallel to the second axis, with a diffraction beam generated from the second moving grating, and receiving a diffraction beam generated from the second fixed grating, with a second photodetection system via the optical member.

According to a twelfth aspect of the present invention, there is provided a second position measuring method of measuring positional information of a movable body that moves along a predetermined plane including a first axis and a second axis that are orthogonal to each other, the method comprising: a first measurement process of measuring positional information of the movable body in a direction parallel to the first axis, by irradiating a first diffraction grating that is arranged on the movable body and has its periodic direction in a direction corresponding to a periodic direction of a first reference grating, with a first measurement beam along an optical path parallel to the first axis, irradiating the first reference grating that is arranged external to the movable body so as to extend in the direction parallel to the first axis and has its periodic direction in the direction parallel to the first axis, with a diffraction beam generated from the first diffraction grating, and receiving a diffraction beam generated from the first reference grating, with a first photodetection system; and a second measurement process of measuring positional information of the movable body in a direction parallel to the second axis, by irradiating a second reference grating that is arranged on the movable body and has its periodic direction in a direction parallel to the second axis, with a second measurement beam along an optical path parallel to the first axis, irradiating a second diffraction grating that is arranged external to the movable body so as to extend in the direction parallel to the first axis and has its periodic direction in a direction corresponding to the periodic direction of the second reference grating, with a diffraction beam generated from the second reference grating, and receiving a diffraction beam generated from the second diffraction grating, with a second photodetection system.

According to a thirteenth aspect of the present invention, there is provided a third position measuring method of measuring positional information of a movable body that moves along a predetermined plane including a first axis and a second axis that are orthogonal to each other, the method comprising: a first measurement process of measuring positional information of the movable body in a direction parallel to the first axis, by irradiating a first moving grating that is comprised in an optical member attached to the movable body, with a first measurement beam along an optical path that at least partially includes a first optical path parallel to the first axis, irradiating a first fixed grating that is arranged external to the movable body so as to extend in a direction parallel to the first axis and has its periodic direction in the direction parallel to the first axis, with a diffraction beam generated from the first moving grating, and receiving a diffraction beam generated from the first fixed grating via the optical member; and a second measurement process of measuring positional information of the movable body in a direction parallel to the second axis, by irradiating a second moving grating that is comprised in the optical member, with a second measurement beam along an optical path that at least partially includes a second optical path close to the first optical path and parallel to the first axis, irradiating a second fixed grating that is arranged external to the movable body so as to extend in the direction parallel to the first axis and has its periodic direction in the direction parallel to the second axis, with a diffraction beam generated from the second moving grating, and receiving a diffraction beam generated from the second fixed grating via the optical member.

According to a fourteenth aspect of the present invention, there is provided a movable body drive method, comprising: a process of measuring positional information of a movable body within a predetermined plane including a first axis and a second axis that are orthogonal to each other by using any one of the first to third position measurement methods of the present invention, the movable body moving along the predetermined plane; and a process of driving the movable body along the predetermined plane based on the positional information of the movable body that has been measured.

According to a fifteenth aspect of the present invention, there is provided an exposure method of forming a pattern on an object by irradiating the object with an energy beam, the method comprising: driving a movable body that holds the object along a predetermined plane by using the movable body drive method of the present invention in order to form the pattern.

According to a sixteenth aspect of the present invention, there is provided a device manufacturing method, comprising: a process of forming a pattern on an object by using the exposure method of the present invention; and a process of applying processing to the object on which the pattern has been formed.

BRIEF DESCRIPTION OF THE DRAWINGS

In the accompanying drawings.

DESCRIPTION OF THE EMBODIMENTS

Figure 1:
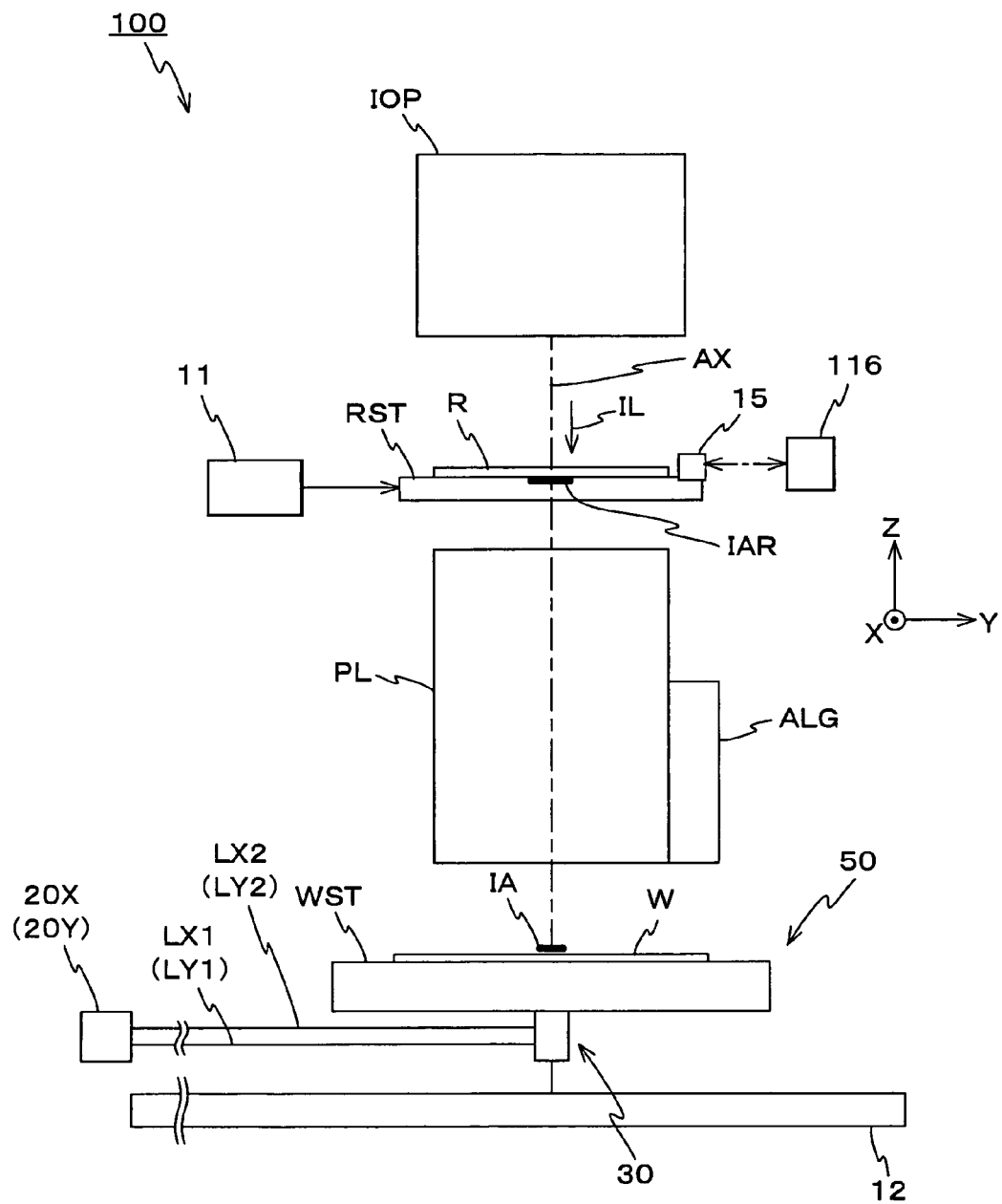
FIG. 1 is a view schematically showing a configuration of an exposure apparatus of an embodiment.

An embodiment of the present invention is described below, with reference to FIGS. 1 to 7. FIG. 1 schematically shows a configuration of an exposure apparatus 100 of the embodiment.

Exposure apparatus 100 is a projection exposure apparatus by a step-and-scan method, which is a so-called scanner. As is described later, a projection optical system PL is arranged in exposure apparatus 100 of the embodiment. In the description below, the explanation is given assuming that a direction parallel to an optical axis AX of projection optical system PL is a Z-axis direction, a direction in which a reticle R and a wafer W are relatively scanned for exposure within a plane orthogonal to the Z-axis direction is a Y-axis direction, and a direction that is orthogonal to a Z-axis and a Y-axis is an X-axis direction, and rotation (inclination) directions around an X-axis, the Y-axis and the Z-axis are θx, θy and θz directions, respectively.

Exposure apparatus 100 is equipped with an illumination unit IOP, a reticle stage RST, projection optical system PL, a stage device 50 including a wafer stage WST and the like, and their control system, and the like. Incidentally, in the drawings such as FIG. 1, wafer W is mounted on wafer stage WST.

Illumination unit IOP includes: a light source; and an illumination optical system that has an illuminance uniformity optical system containing an optical integrator and the like, and a reticle blind and the like (none of which are shown), as is disclosed in, for example, U.S. Patent Application Publication No. 2003/0025890 and the like. Illumination unit IOP illuminates a slit-shaped illumination area IAR that is defined by the reticle blind (the masking system) on reticle R with an illumination light (exposure light) IL with substantially uniform illuminance. As illumination light IL, an ArF excimer laser light (wavelength: 193 nm) is used as an example.

On reticle stage RST, reticle R having a pattern surface (the lower surface in FIG. 1) on which a circuit pattern and the like are formed is fixed by, for example, vacuum suction. Reticle stage RST is finely drivable within an XY plane and also drivable at a predetermined scanning speed in a scanning direction (which is the Y-axis direction being a lateral direction of the page surface of FIG. 1), by a reticle stage drive system 11 that includes, for example, a linear motor or the like.

Positional information (including rotational information in the θz direction) within the XY plane of reticle stage RST is constantly detected at a resolution of, for example, about 0.25 nm with a reticle laser interferometer (hereinafter, referred to as a "reticle interferometer") 116 via a movable mirror 15 (in actuality, a Y movable mirror (or a retroreflector) having a reflection surface orthogonal to the Y-axis and an X movable mirror having a reflection surface orthogonal to the X-axis are arranged). The measurement values of reticle interferometer 116 are sent to a controller 10 (not shown in FIG. 1, refer to FIG. 7).

As projection optical system PL, for example, a dioptric system that is composed of a plurality of optical elements (lens elements) disposed along optical axis AX parallel to the Z-axis direction is used. Projection optical system PL is, for example, both-side telecentric and has a predetermined projection magnification (e.g. one-quarter or one-fifth times). Therefore, when illumination area IAR on reticle R is illuminated by illumination unit IOP, illumination light IL having passed through reticle R whose pattern surface is placed substantially coincident with a first plane (an object plane) of projection optical system PL forms a reduced image of a circuit pattern (a reduced image of a part of a circuit pattern) of reticle R within illumination area IAR on an area (hereinafter, also referred to as an "exposure area") IA that is conjugate to illumination area IAR on wafer W, which is placed on the second plane (the image plane) side of projection optical system PL and whose surface is coated with a resist (a sensitive agent), via projection optical system PL. Then, by moving reticle R in the scanning direction (the Y-axis direction) relative to illumination area IAR (illumination light IL) and also moving wafer W in the scanning direction (the Y-axis direction) relative to exposure area IA (illumination light IL) by synchronous drive of reticle stage RST and wafer stage WST, scanning exposure of one shot area (divided area) on wafer W is performed, and a pattern of reticle R is transferred to the shot area. That is, in the embodiment, a pattern of reticle R is generated on wafer W by illumination unit IOP and projection optical system PL, and the pattern is formed on wafer W by exposure of a sensitive layer (a resist layer) on wafer W with illumination light IL.

In the vicinity of the side surface of projection optical system PL, an alignment system ALG is arranged. As alignment system ALG, a sensor by an image processing method, which is disclosed in, for example, U.S. Pat. No. 5,493,403 and the like, can be used. Detection results obtained by alignment system ALG are sent to controller 10 (refer to FIG. 7).

Stage device 50 is equipped with a stage platform 12 that is horizontally supported via a vibration isolation mechanism (not shown) on a floor surface, wafer stage WST arranged on stage platform 12, a wafer drive system 124 (not shown in FIG. 1, refer to FIG. 7) that drives wafer stage WST, a position measuring system 200 (not shown in FIG. 1, refer to FIG. 7) that measures positional information of wafer stage WST within the XY plane.

Figure 2A:
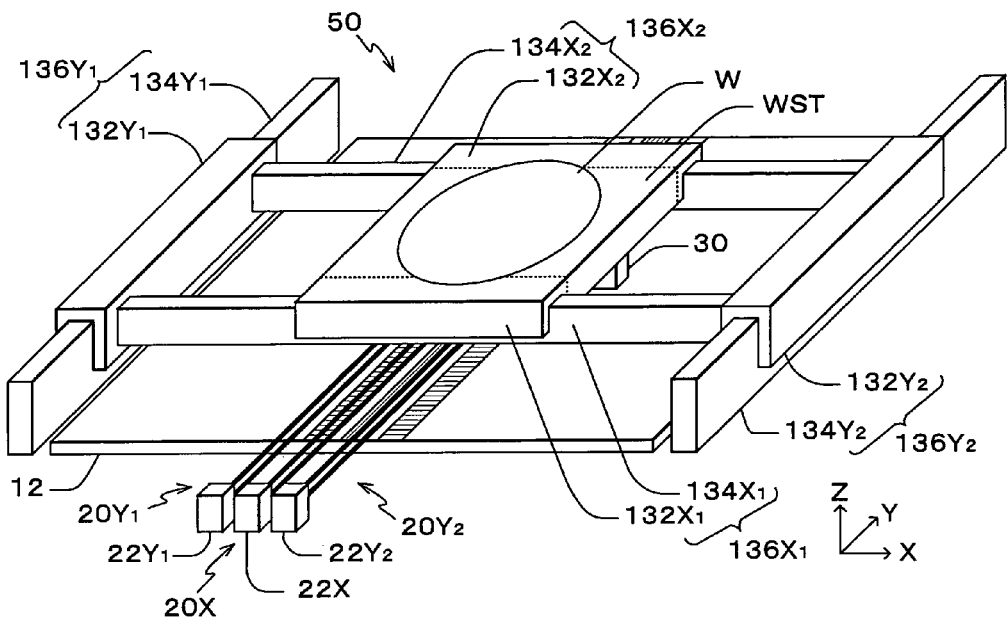
FIG. 2A is a perspective view showing a stage device with partial omission, which is equipped in the exposure apparatus shown in FIG. 1.

FIG. 2A shows a perspective view of stage device 50 with a part being omitted. As shown in FIG. 2A, on one side and the other side of stage platform 12 in the X-axis direction, a pair of Y-axis linear motors $136Y_1$ and $136Y_2$ are placed respectively. Y-axis linear motors $136Y_1$ and $136Y_2$ are equipped with Y stators $134Y_1$ and $134Y_2$ that are installed on the floor surface with the Y-axis direction serving as their longitudinal directions, and Y movers $132Y_1$ and $132Y_2$ that engage with Y stators $134Y_1$ and $134Y_2$ in a noncontact manner, respectively, via an air bearing or the like (not shown). As Y-axis linear motors $136Y_1$ and $136Y_2$, a linear motor of either a moving magnet type or a moving coil type can be used.

Y movers $132Y_1$ and $132Y_2$ have the Y-axis direction serving as their longitudinal directions, and each have an inverted U-shaped XZ sectional surface. Y movers $132Y_1$ and $132Y_2$ are fixed to one end and the other end in the longitudinal direction of a pair of X stators $134X_1$ and $134X_2$, respectively. A pair of X movers $132X_1$ and $132X_2$ engage with X stators $134X_1$ and $134X_2$ in a noncontact manner, respectively, via an air bearing or the like (not shown). In the embodiment, X movers $132X_1$ and $132X_2$ constitute a part of wafer stage WST. More specifically, as shown in FIG. 2A, wafer stage WST has a main section having a rectangular plate shape on which wafer W is mounted via a wafer holder (not shown) and X movers $132X_1$ and $132X_2$ that are integrally arranged on the +Y side and −Y side of the main section and have the X-axis direction serving as their longitudinal directions. In this case, X stators $134X_1$ and $134X_2$, and X movers $132X_1$ and $132X_2$ that individually engage with X stators $134X_1$ and $134X_2$ constitute X-axis linear motors $136X_1$ and $136X_2$, respectively. Also as X-axis linear motors $136X_1$ and $136X_2$, a liner motor of either a moving magnet type of a moving coil type can be used.

Figure 3A:
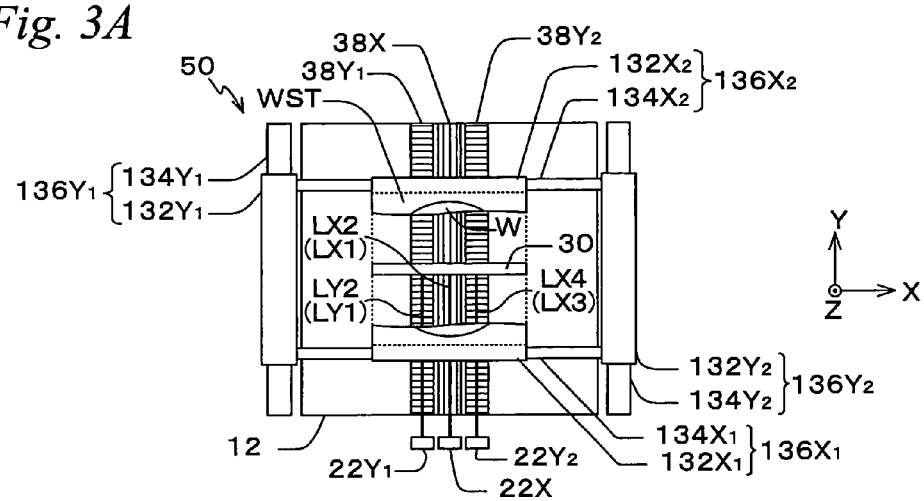
FIGS. 3A to 3C are views used to explain the function of a stage drive system equipped in the exposure apparatus of the embodiment.
Figure 3B:
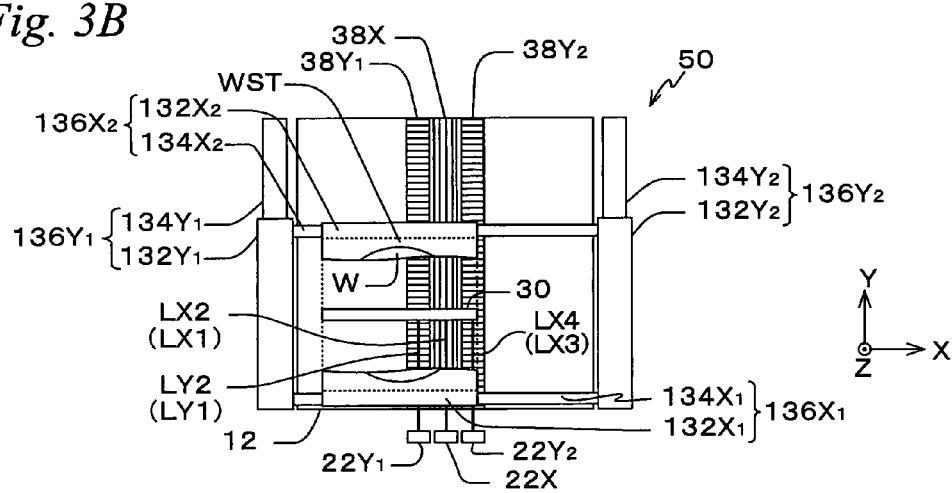
Figure 3C:
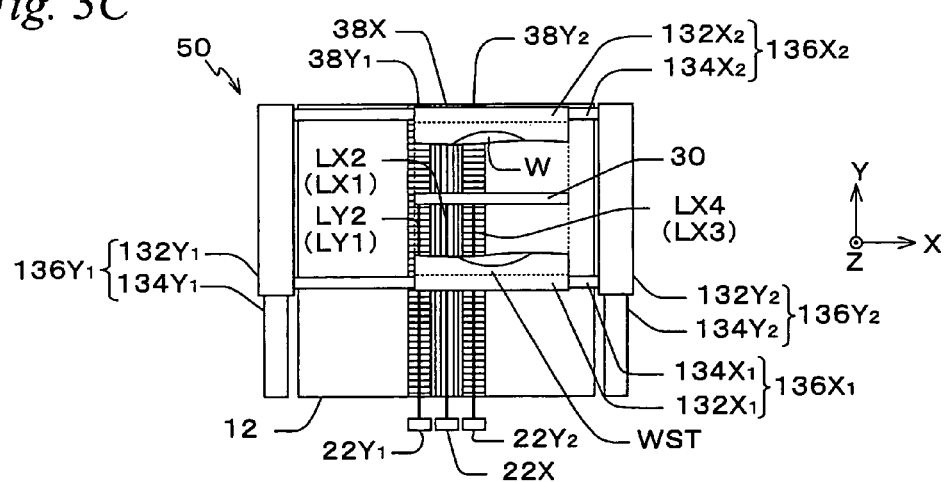

In the embodiment, an XY drive system, which freely drives wafer stage WST in the XY two-dimensional directions on stage platform 12 as shown in the drawings such as FIGS. 3A to 3C, is configured including Y-axis linear motors $136Y_1$ and $136Y_2$ and X-axis linear motors $136X_1$ and $136X_2$ described above. Incidentally, in FIGS. 3A to 3C, wafer stage WST is shown with a part thereof being fractured, in order to show the respective constituents of an encoder system 150 (to be described later). FIG. 3A shows a state where wafer stage WST is positioned in substantially the center on stage platform 12. And, FIG. 3B shows a state where wafer stage WST is moved to an area near a corner between the −X side end and the −Y side end on stage platform 12, by being driven in the −X direction by X-axis linear motors $136X_1$ and $136X_2$ and driven in the −Y direction by Y-axis linear motors $136Y_1$ and $136Y_2$ from the position shown in FIG. 3A. Further, FIG. 3C shows a state where wafer stage WST is moved to an area near a corner between the +X side end and the +Y side end on stage platform 12, by being driven in the +X direction by X-axis linear motors $136X_1$ and $136X_2$ and driven in the +Y direction by Y-axis linear motors $136Y_1$ and $136Y_2$ from the position shown in FIG. 3A.

In the embodiment, by making driving forces (thrust forces) in the X-axis direction to wafer stage WST, which are respectively generated by X-axis linear motors $136X_1$ and $136X_2$, be different from each other, it is also possible to make wafer stage WST rotate in the θz direction.

In the embodiment, although not shown in the drawings, the wafer holder that holds a wafer is mounted on wafer stage WST via a Z-tilt drive mechanism (not shown). The Z-tilt drive mechanism includes a drive mechanism (e.g. a voice coil motor or the like) that supports the wafer holder at different three points and also drives each support point in the Z-axis direction. The Z-tilt drive mechanism finely drives the wafer holder on wafer stage WST in the Z-axis direction, the θx direction and the θy direction. In the embodiment, wafer drive system 124 (refer to FIG. 7), which drives wafer W (the wafer holder) on stage platform 12 in directions of six degrees of freedom, is configured including the XY drive system described above and the Z-tilt drive mechanism. The respective constituents of wafer drive system 124 are controlled by controller 10 (refer to FIG. 7).

Figure 7:
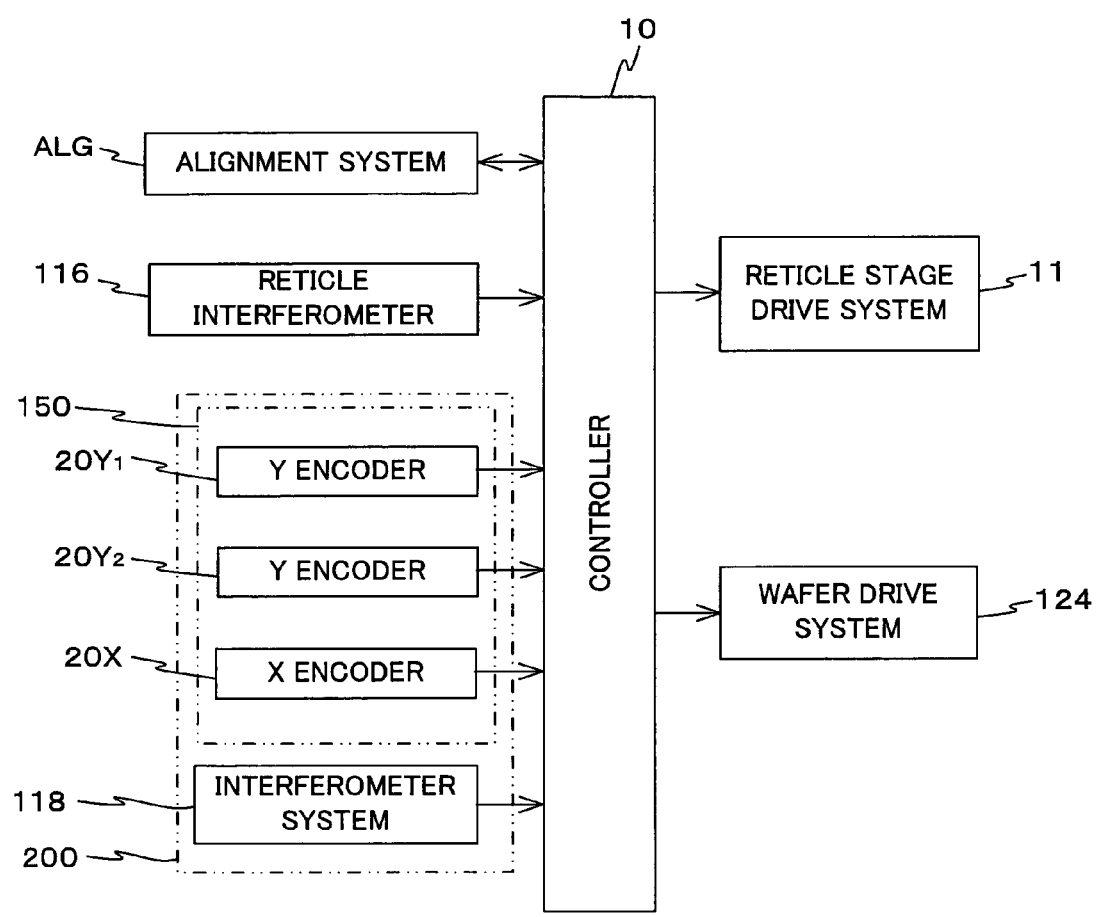
FIG. 7 is a block diagram showing a main configuration of a control system of the exposure apparatus shown in FIG. 1.

Positional information of wafer stage WST is constantly detected with position measuring system 200 (refer to FIG. 7), and the detection results are sent to controller 10 (refer to FIG. 7). Position measuring system 200 is equipped with an interferometer system 118 and encoder system 150 (refer to FIG. 7).

Interferometer system 118 measures positional information of wafer stage WST in at least directions of three degrees of freedom (X, Y and θz) within the XY plane. In the embodiment, position control of wafer stage WST in the directions of three degrees of freedom within the XY plane is performed by controller 10 mainly based on the measurement values of encoder system 150. Interferometer system 118 is secondarily used, for example, for backup at the time of output abnormality of encoder system 150 and/or position measurement at the time of calibration of encoder system 150, and the like. Incidentally, position control of wafer stage WST can be performed using interferometer system 118 and encoder system 150 together.

Figure 2B:
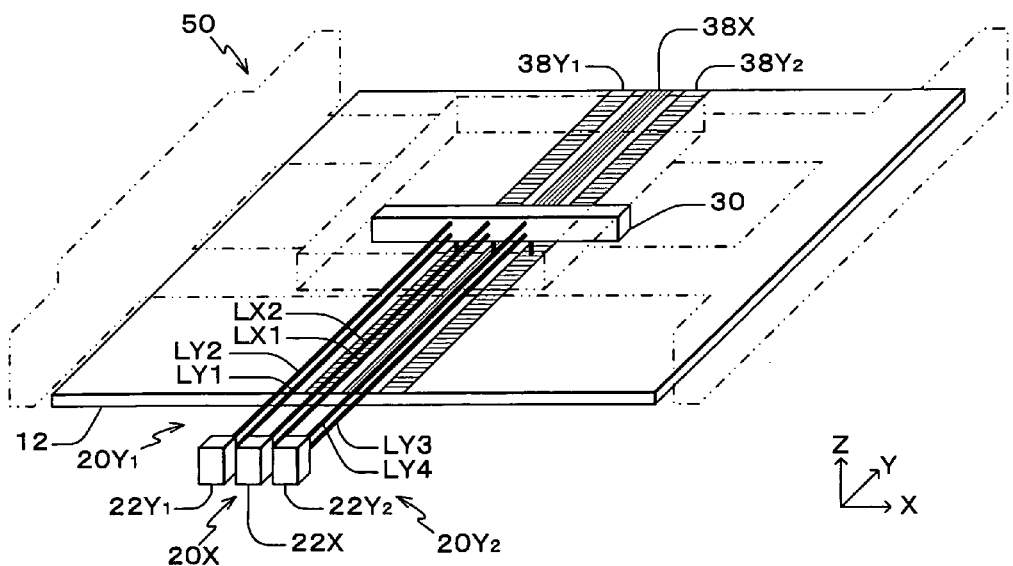
FIG. 2B is a view showing a state after a wafer drive system and a wafer stage are removed from the view in FIG. 2A.

Encoder system 150 is equipped with two Y encoders $20Y_1$ and $20Y_2$, and an X encoder 20X, as shown in a perspective view in FIG. 2A. FIG. 2B shows a state where wafer drive system 124 and wafer stage WST are removed (their outlines are shown in virtual lines (two-dot chain lines)) from FIG. 2A.

Y encoders $20Y_1$ and $20Y_2$ and an X encoder 20X are equipped with encoder units $22Y_1$, $22Y_2$ and 22X, respectively, each of which includes a light source and a photodetection element inside. As shown in FIGS. 2A and 2B, encoder units $22Y_1$, $22Y_2$ and 22X are installed at positions that are a predetermined distance apart on the −Y side of stage platform 12 and correspond to an area near the center of stage platform 12 in the X-axis direction. Encoder units $22Y_1$, $22Y_2$ and 22X respectively emit coherent beams, e.g. laser beams (hereinafter, referred to as measurement beams) LY1, LY3, and LX1 each having a wavelength λ (=850 nm).

In this case, optical paths of three measurement beams LY1, LY3 and LX1 are all parallel to the Y-axis and are close to each other. In the embodiment, the optical path of measurement beam LX1 is set so as to be orthogonal to optical axis AX (refer to FIG. 1) of projection optical system PL. Further, the optical paths of measurement beams LY1 and LY3 are placed an equal distance apart from the optical path of measurement beam LX1 in the −X direction and the +X direction, respectively, within the same XY plane that is positioned slightly on the +Z side compared with the optical path of measurement beam LX1.

Measurement beams LY1, LY3 and LX1 are irradiated to a mirror block 30 with the X-axis direction serving as its longitudinal direction. As shown in FIG. 2A (and FIG. 2B), mirror block 30 is attached (fixed) to the bottom surface (lower surface) of wafer stage WST. Mirror block 30 is a optical component (whose structure in detail is described later on) having a quadrangular prism shape that is composed of the material that transmits the laser beam having a wavelength λ, and is fixed to substantially the center in the Y-axis direction of the bottom surface of wafer stage WST, with its one surface (the −Y side surface) parallel to the XZ plane being opposed to encoder units $22Y_1$, $22Y_2$ and 22X, and with its another surface (the lower surface) parallel to the XY plane being opposed to stage platform 12. The length of mirror block 30 in the X-axis direction is set to an appropriate length according to a movement stroke of wafer stage WST in the X-axis direction. More specifically, the length is set so that three measurement beams LY1, LY3 and LX1 are irradiated to the −Y side surface of mirror block 30 without fail in all the movement strokes of wafer stage WST in the X-axis direction. In the embodiment, the length is set substantially equal to the width of wafer stage WST in the X-axis direction.

Next, a concrete configuration of encoder system 150 and a measurement principle of Y encoders $20Y_1$, $20Y_2$ and X encoder 20X are described referring to FIGS. 4A to 6B.

Figure 4A:
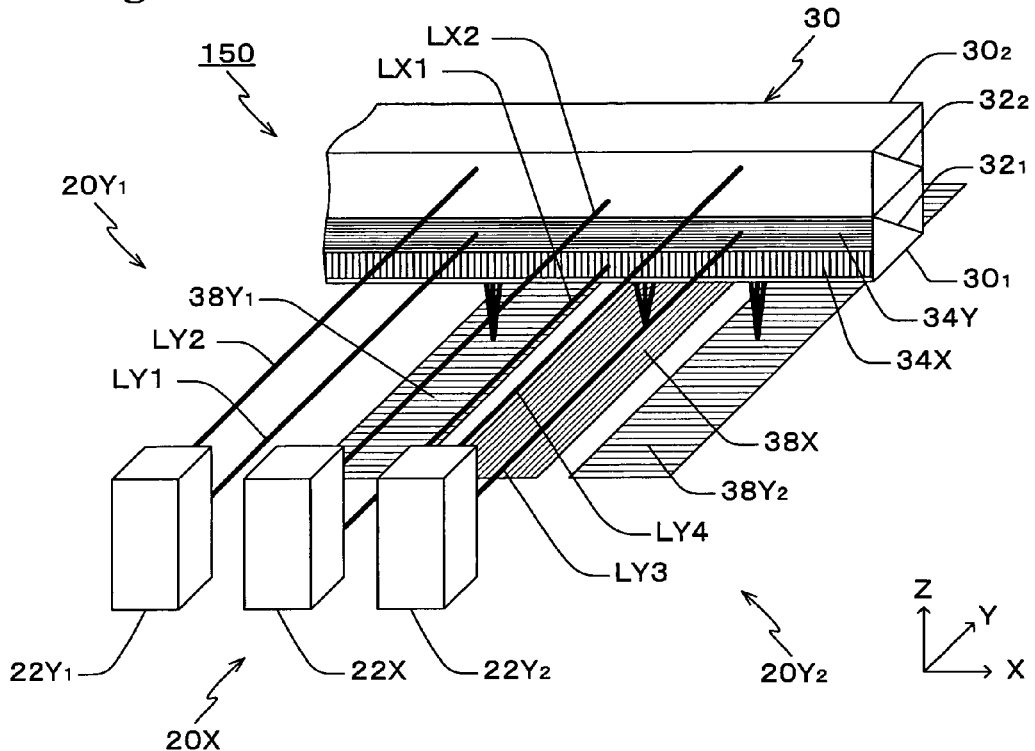
FIGS. 4A and 4B are views used to explain a configuration of an encoder system equipped in the exposure apparatus of the embodiment.
Figure 4B:
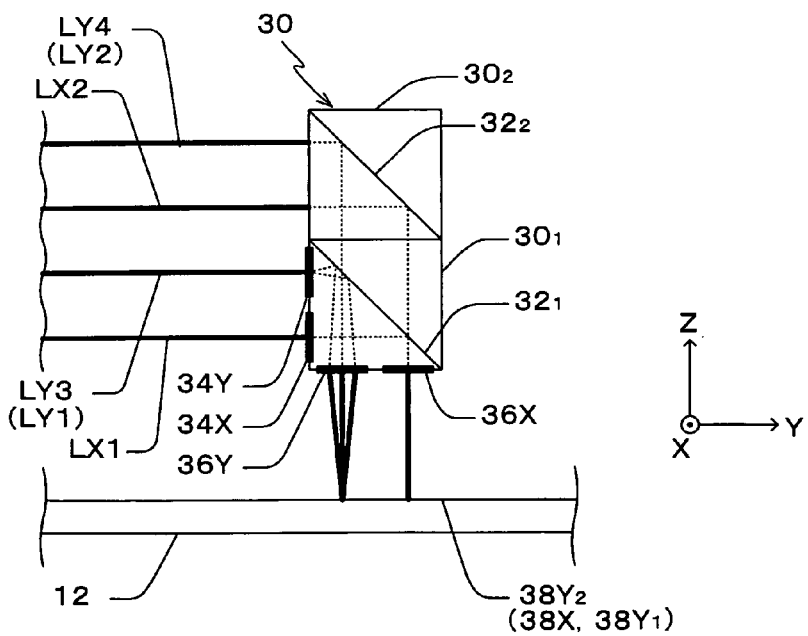
Figure 5A:
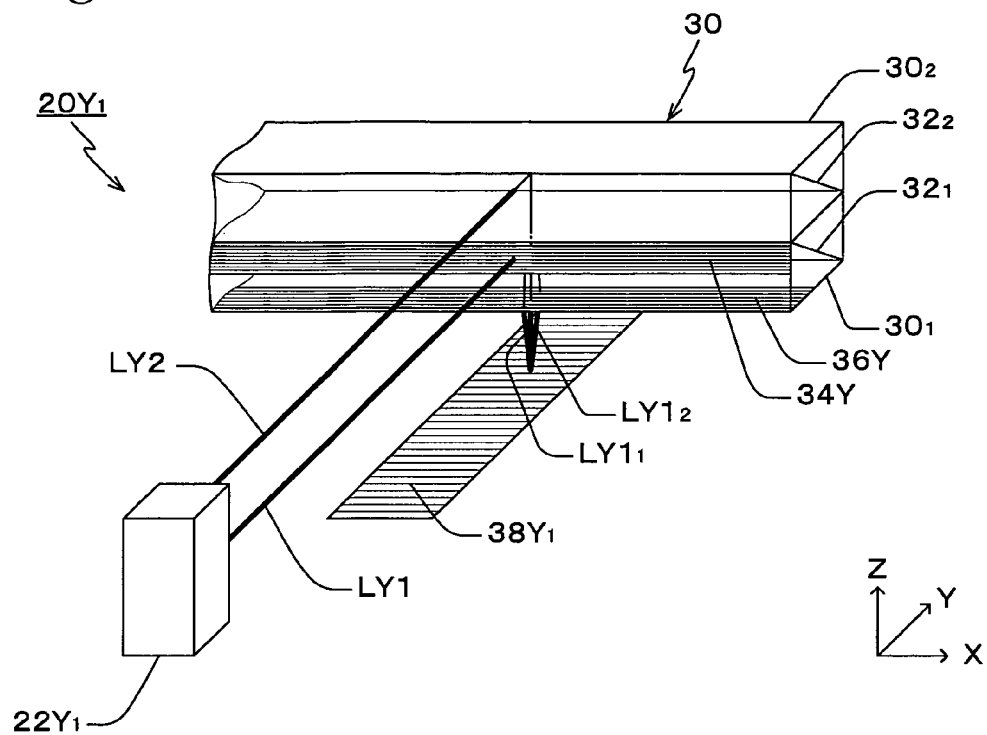
FIGS. 5A and 5B are views used to explain a configuration of a Y encoder.
Figure 5B:
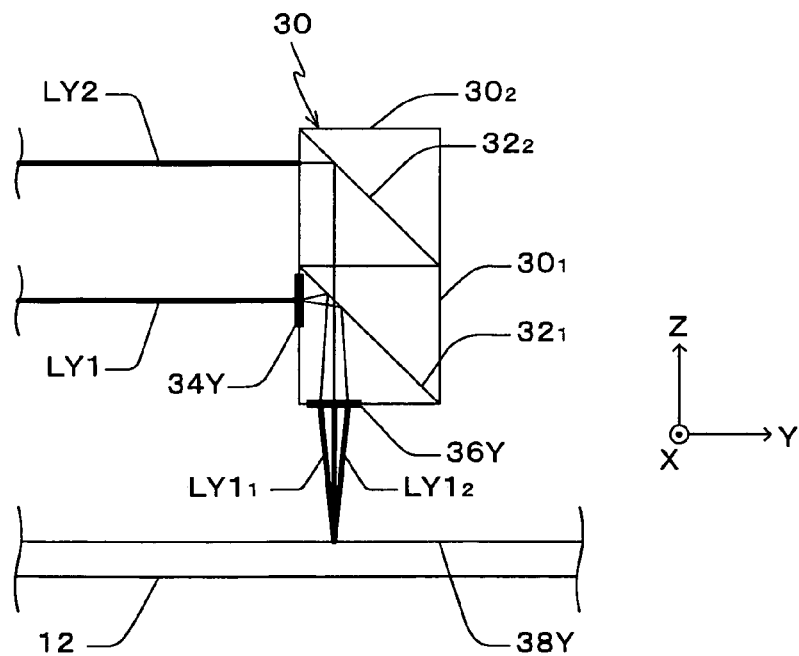
Figure 6A:
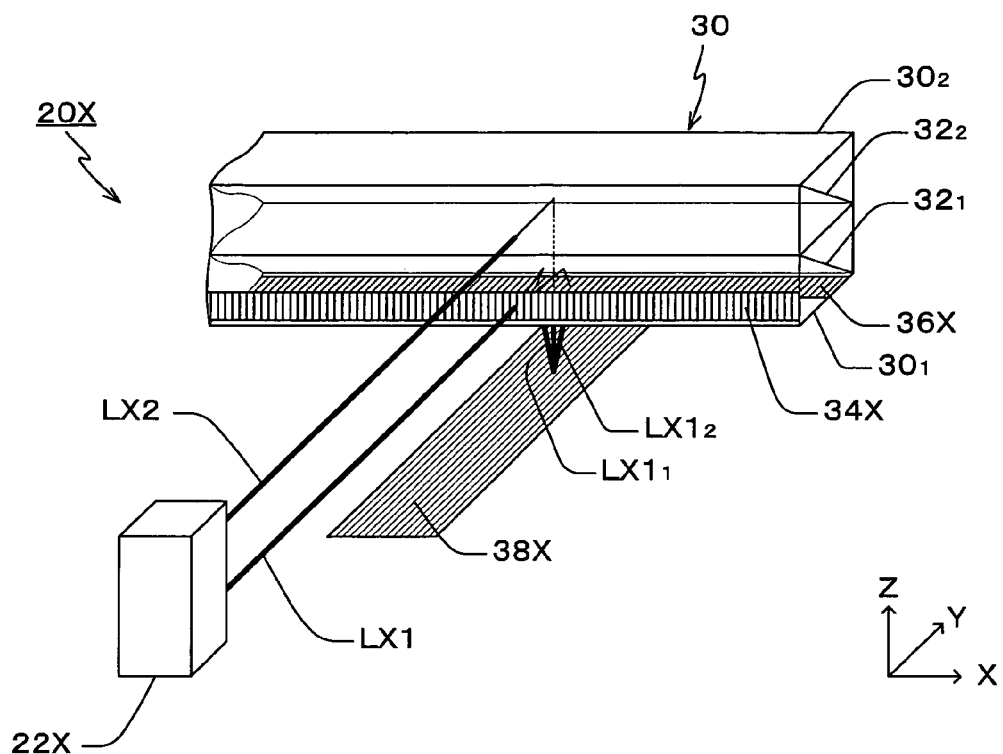
FIGS. 6A and 6B are views used to explain a configuration of an X encoder.
Figure 6B:
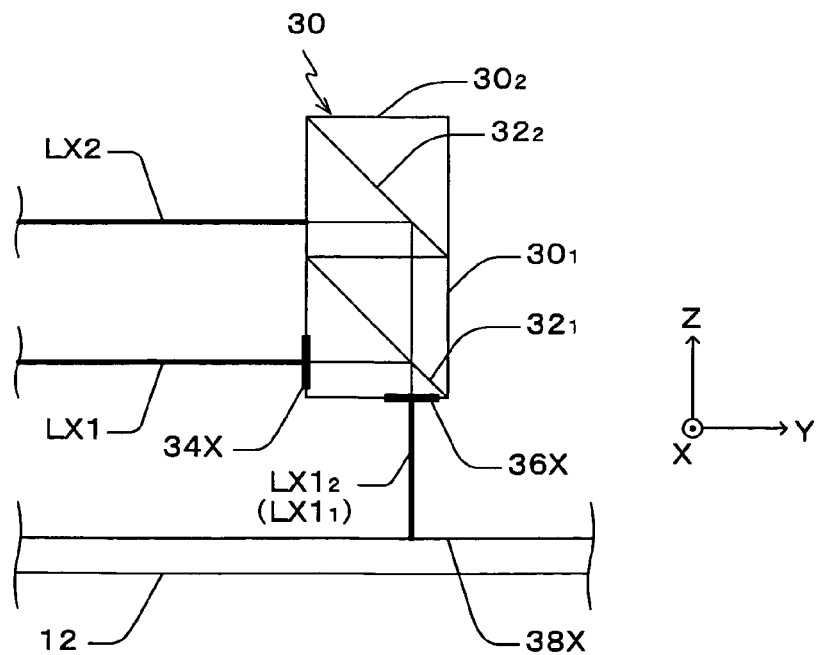

FIGS. 4A and 4B schematically show a configuration of Y encoders $20Y_1$, $20Y_2$ and X encoder 20X, including mirror block 30. In FIG. 4B, the optical paths of three measurement beams LY1, LY3 and LX1 within the mirror block are shown in broken lines. However, in FIG. 4B, measurement beams LY1 and LY3 overlap in an orthogonal direction to the page surface (the depth direction). And, FIGS. 5A and 5B show only the essential constituents of Y encoder $20Y_1$ to be focused on, among the constituents of encoder system 150. Further, FIGS. 6A and 6B show only the essential constituents of X encoder 20X to be focused on, among the constituents of encoder system 150. In each of FIGS. 5A and 6A, the inside of mirror block 30 is also shown except for a part thereof.

As shown in FIGS. 4A to 6B, mirror block 30 is an optical component that is composed of two quadrangular-prism-shaped blocks $30_1$ and $30_2$ piled and integrated in the vertical direction, each of which has the same size and a square-shaped YZ sectional surface, and the X-axis direction serving as their longitudinal direction. Block $30_1$ on the lower side is composed of a split optical element (which is also called a beam splitter prism) having a shape like two right angle prisms that are integrated with their slant surfaces being opposed to each other. In this case, on the slant surface of at least one of the right angle prisms, for example, a dielectric multilayer, a metallic thin film, or the like is formed on its surface, and in the state after the integration, the slant surface serves as a reflection surface $32_1$ having a transmittance and a reflectance at the same level of measurement beams LY1, LY3 and LX1, which is similar to a half mirror. On the other surfaces of block $30_1$, an antireflection film is formed. Although block $30_2$ on the upper side can be configured of a beam splitter prism similar to block $30_1$, an optical element having a shape like two right angle prisms that are integrated, with their slant surfaces being opposed to each other and with one of the slant surfaces having a reflection film formed thereon, is used in the embodiment. In this case, the surface formed by the respective slant surfaces serves as a total reflection surface $32_2$. The −Y side surfaces of two blocks $30_1$ and $30_2$ form a coplanar surface.

As shown in the drawings such as FIGS. 4A and 5A, on the upper half (+Z side) of the −Y side surface of block $30_1$, a moving grating 34Y is placed with the X-axis direction serving as its longitudinal direction. And, on the lower half (−Z side) of the −Y side surface of block $30_1$, that is, on the −Z side of moving grating 34Y, a moving grating 34X is placed with the X-axis direction serving as its longitudinal direction. Moving gratings 34Y and 34X are transmissive-type diffraction gratings having their periodic directions in the Z-axis direction and the X-axis direction respectively. And, the length of each of moving gratings 34Y and 34X in the longitudinal direction is substantially the same as the length of mirror block 30.

Further, as shown in FIGS. 5A, 5B and 4B, on the −Y side half of the −Z side surface of block $30_1$, a moving grating 36Y is placed with the X-axis direction serving as its longitudinal direction. And, on the +Y side half of the −Z side surface of block $30_1$, that is, on the +Y side of moving grating 36Y, a moving grating 36X is placed with the X-axis direction serving as its longitudinal direction, as shown in FIGS. 6A, 6B and 4B. Moving gratings 36Y and 36X are each configured of a transmissive-type diffraction grating having its periodic direction in the Y-axis direction or the X-axis direction, respectively. Further, the length of each of moving gratings 36Y and 36X in the longitudinal direction is substantially the same as the length of mirror block 30.

On the upper surface of stage platform 12, as shown in the drawings such as FIG. 2B, fixed gratings $38Y_1$, $38Y_2$ and 38X are respectively arranged extending in the Y-axis direction. Fixed gratings $38Y_1$, $38Y_2$ and 38X are placed so as to correspond to the optical paths of measurement beams LY1, LY3 and LX1, respectively. More specifically, fixed grating 38X is placed in substantially the center in the X-axis direction on the upper surface of stage platform 12, and fixed gratings $38Y_1$ and $38Y_2$ are placed on the −X side and the +X side of fixed grating 38X, respectively. Each of fixed gratings $38Y_1$ and $38Y_2$ is a reflective-type diffraction grating having its periodic direction in the Y-axis direction formed on the upper surface of stage platform 12 parallel to the XY plane. Further, fixed grating 38X is a reflective-type diffraction grating having its periodic direction in the X-axis direction formed on the upper surface of stage platform 12. The length of each of fixed gratings $38Y_1$, $38Y_2$ and 38X in the Y-axis direction is set to a length that coves the movement stroke of wafer stage WST in the Y-axis direction. More specifically, the length is set so that three measurement beams LY1, LY3 and LX1 emitted from mirror block 30 as is described later (to be more precise, diffraction beams derived from the measurement beams) are irradiated to fixed gratings $38Y_1$, $38Y_2$ and 38X without fail in all the movement strokes of wafer stage WST in the Y-axis direction.

Now, the measurement principle of the Y encoder is described, representatively focusing on Y encoder $20Y_1$.

Measurement beam LY1 emitted from encoder unit $22Y_1$ is perpendicularly irradiated to moving grating 34Y placed at mirror block 30, as shown in, for example, FIG. 5A. Accordingly, a plurality of diffraction beams whose diffraction angles are different within the YZ plane are generated from moving grating 34Y. In FIGS. 5A and 5B, the ±first order diffraction beams of the plurality of diffraction beams are representatively shown. These diffraction beams are transmitted through block $30_1$ and are reflected off reflection surface $32_1$, and then irradiated on moving grating 36Y after their optical paths are deflected in the −Z direction. Consequently, a plurality of diffraction beams, which are derived from the diffraction beams generated at moving grating 34Y, are generated from moving grating 36Y. In FIGS. 5A and 5B, a −first order diffraction beam $LY1_1$ derived from the +first order diffraction beam generated from moving grating 34Y and a +first order diffraction beam $LY1_2$ derived from the −first order diffraction beam generated from moving grating 34Y are shown.

Diffraction beams $LY1_1$ and $LY1_2$ generated from moving grating 36Y are emitted from block $30_1$ (mirror block 30) and irradiated to fixed grating $38Y_1$ described above. Accordingly, a plurality of diffraction beams derived from diffraction beams $LY1_1$ and $LY1_2$ are generated from fixed grating $38Y_1$.

In this case, a −first order diffraction beam derived from diffraction beam $LY1_1$ and a +first order diffraction beam derived from diffraction beam $LY1_2$ are converged (synthesized) on a same axis parallel to the Z-axis to be a synthetic beam LY2. Synthetic beam LY2 returns to block $30_1$ (mirror block 30), and is sequentially transmitted through moving grating 36Y and reflection surface $32_1$ and enters block $30_2$. Then, synthetic beam LY2 is reflected off total reflection surface $32_2$, and its optical path is deflected in the −Y direction and synthetic beam LY2 is emitted from the −Y side surface of block $30_2$ as an output beam. Then, synthetic beam LY2 returns to encoder unit $22Y_1$ along the optical path parallel to the Y-axis, and is received by the photodetection element (not shown) within encoder unit $22Y_1$ and its intensity is measured.

The intensity of synthetic beam (output beam) LY2 sinusoidally varies with respect to the relative displacement between moving grating 36Y and fixed grating $38Y_1$ in the Y-axis direction due to diffraction beams generated from fixed grating $38Y_1$ interfering with each other. Therefore, encoder unit $22Y_1$ detects the phase difference of the diffraction beams from the intensity variation of synthetic beam (output beam) LY2, and from the phase difference, obtains the relative displacement between moving grating 36Y and fixed grating $38Y_1$ in the Y-axis direction.

The diffraction angles of the diffraction beams generated from moving gratings 34Y and 36Y are determined by the wavelength of measurement beam LY1 and the pitches of moving gratings 34Y and 36Y. Similarly, the diffraction angles of the diffraction beams generated from fixed grating $38Y_1$ are determined by the wavelength of measurement beam LY1 and the pitch of fixed grating $38Y_1$. In the embodiment, the pitches of moving gratings 34Y and 36Y and fixed grating $38Y_1$ are appropriately set depending on the wavelength of measurement beam LY1 so that the −first order diffraction beam derived from diffraction beam $LY1_1$ and the +first order diffraction beam derived from diffraction beam $LY1_2$, which are parallel to the Z-axis, are generated from fixed grating $38Y_1$. Along with this, the positional relation between moving gratings 34Y and 36Y, and fixed grating $38Y_1$ is appropriately set so that the two diffraction beams described above generated from fixed grating $38Y_1$ are converged on a same axis.

Y encoder $20Y_2$ irradiates measurement beam LY3 from encoder unit $22Y_2$ perpendicularly to moving grating 34Y, and similar to Y encoder $20Y_1$, obtains a synthetic beam (output beam) LY4, and obtains the relative displacement between moving grating 36Y and fixed grating $38Y_2$ in the Y-axis direction from the intensity variation of synthetic beam (output beam) LY4.

Next, the measurement principle of X encoder 20X is described. Measurement beam LX1 emitted from encoder unit 22X is perpendicularly irradiated to moving grating 34X placed at mirror block 30, as shown in, for example, FIG. 6A. Accordingly, a plurality of diffraction beams whose diffraction angles are different within the XY plane are generated from moving grating 34X. In FIGS. 6A and 6B, ±first order diffraction beams of the plurality of diffraction beams are representatively shown. In FIG. 6B, however, these diffraction beams overlap with each other in a direction orthogonal to the page surface (the depth direction). These diffraction beams are transmitted through block $30_1$ and are reflected off reflection surface $32_1$, and their optical paths are deflected in the −Z direction, and then the diffraction beams are irradiated to moving grating 36X. Accordingly, a plurality of diffraction beams, which are derived from the diffraction beams generated at moving grating 34X, are generated from moving grating 36X. In FIGS. 6A and 6B, a −first order diffraction beam LX1₁ derived from the +first order diffraction beam generated from moving grating 34X and a +first order diffraction beam LX1₂ derived from the −first order diffraction beam generated from moving grating 34X are shown. In FIG. 6B, however, these diffraction beams overlaps with each other in a direction perpendicular to the page surface.

Diffraction beams LX1₁ and LX1₂ generated from moving grating 36X are emitted from block 30₁ (mirror block 30) and irradiated to fixed grating 38X described earlier. Accordingly, a plurality of diffraction beams derived from diffraction beams LX1₁ and LX1₂ are generated from fixed grating 38X. In this case, a −first order diffraction beam derived from diffraction beam LX1₁ and a +first order diffraction beam derived from diffraction beam LX1₂ are converged (synthesized) on a same axis parallel to the Z-axis to be a synthetic beam LX2. Synthetic beam LX2 returns to block 30₁ (mirror block 30), and is sequentially transmitted through moving grating 36X and reflection surface 32₁ and enters block 30₂. Then, synthetic beam LX2 is reflected off total reflection surface 32₂, and its optical path is deflected in the −Y direction and synthetic beam LX2 is emitted from the −Y side surface of block 30₂ as an output beam. Then, synthetic beam LX2 returns to encoder unit 22X along the optical path parallel to the Y-axis, and is received by the photodetection element (not shown) within encoder unit 22X and its intensity is measured. Then, encoder unit 22X detects the phase difference of the diffraction beams from the intensity variation of synthetic beam (output beam) LX2, and obtains the relative displacement between moving grating 36X and fixed grating 38X in the X-axis direction from the phase difference.

In this case as well, the positional relation between moving gratings 34X and 36X, and fixed grating 38X is appropriately set so that the diffraction beams generated from fixed grating 38X are converged on a same axis parallel to the Z-axis in accordance with the wavelength of measurement beam LX1, the pitches of moving gratings 34X and 36X and the pitch of fixed grating 38X.

The measurement values of the relative displacement obtained by Y encoders 20Y₁ and 20Y₂ are respectively supplied to controller 10. Based on the average value of the measurement values of the relative displacement obtained by Y encoders 20Y₁ and 20Y₂, controller 10 computes the displacement of wafer stage WST from a reference position in the Y-axis direction, that is, the position in the Y-axis direction (Y-position). Further, based on the difference between the measurement values of the relative displacement obtained by Y encoders 20Y₁ and 20Y₂, controller 10 measures yawing (rotation in the θz direction) of wafer stage WST with high precision. And, the measurement value of the relative displacement obtained by X encoder 20X is supplied to controller 10. Based on the measurement value of the relative displacement obtained by X encoder 20X, controller 10 computes the displacement of wafer stage WST from a reference position in the X-axis direction, that is, the position in the X-axis direction (X-position).

As is obvious from the description above, unlike an interferometer, Y encoder 20Y₁ that constitutes a part of encoder system 150 related to the embodiment does not synthesize the measurement beam returning from wafer stage WST and a reference beam prepared separately to measure the intensity of the synthetic beam, but synthesizes the diffraction beams generated from moving gratings 34Y and 36Y at fixed grating 38Y₁ and measures the intensity of the synthetic beam. More specifically, synthetic beam (output beam) LY2 that is subject to measurement of the intensity variation is obtained by not being synthesized within encoder unit 22Y₁, but being synthesized on the side of wafer stage WST that is subject to position measurement. Therefore, even if synthetic beam (output beam) LY2 is affected by air fluctuations while returning from wafer stage WST (mirror block 30) to encoder unit 22Y₁, the phase difference between the diffraction beams detected from the intensity variation of synthetic beam (output beam) LY2 does not vary. Accordingly, Y encoder 20Y₁ is hard to be affected by air fluctuations even if wafer stage WST is apart from encoder unit 22Y₁. Similarly, Y encoder 20Y₂ is hard to be affected by air fluctuations. As a consequence, high-precision measurement of the Y-position of wafer stage WST can be performed by using Y encoders 20Y₁ and 20Y₂.

Similarly, X encoder 20X is hard to be affected by air fluctuations even if wafer stage WST is apart from encoder unit 22X. Consequently, high-precision measurement of the X-position of wafer stage WST can be performed by using X encoder 20X.

Now, configurations of Y encoders 20Y₁ and 20Y₂ and X encoder 20X in the embodiment are described, focusing on functions of diffraction gratings that constitute the encoders.

Y encoder 20Y₁ described earlier is an encoder by a diffraction interference method that uses three gratings, which are moving gratings 34Y and 36Y and fixed grating 38Y₁. In this case, even if wafer stage WST to which mirror block 30 is fixed is displaced in the measurement direction (Y-axis direction) of Y encoder 20Y₁, the irradiation point of measurement beam LY1 is not displaced on moving gratings 34Y and 36Y in their periodic directions. Accordingly, moving grating 34Y has only the function of making measurement beam LY be diffracted and generating at least two diffraction beams (e.g. ±first order diffraction beams). And, moving grating 36Y has only the function of making the two diffraction beams generated from moving grating 34Y be diffracted to generate diffraction beams LY1₁ and LY1₂, and irradiating diffraction beams LY1₁ and LY1₂ at substantially the same point on fixed grating 38Y₁.

Meanwhile, when wafer stage WST is displaced in the Y-axis direction, the irradiation points of diffraction beams LY1₁ and LY1₂ derived from measurement beam LY1 are displaced on fixed grating 38Y₁ in its periodic direction (Y-axis direction). Accordingly, fixed grating 38Y₁ has not only the function of making diffraction beams LY1₁ and LY1₂ that are irradiated be diffracted and synthesized on a same axis to generate synthetic beam LY2, but also the function as a reference grating that generates the phase difference between diffraction beams LY1₁ and LY1₂ in accordance with the relative displacement between moving grating 36Y (i.e. wafer stage WST) and fixed grating 38Y₁ in the Y-axis direction.

Y encoder 20Y₂ described earlier is an encoder by a diffraction interference method that uses three gratings, which are moving gratings 34Y and 36Y and fixed grating 38Y₂. In Y encoder 20Y₂, the respective diffraction gratings have the similar functions to those of Y encoder 20Y₁. Accordingly, fixed grating 38Y₂ has also the function of the reference grating as described above.

Further, X encoder 20X described earlier is an encoder by a diffraction interference method that uses three gratings, which are moving gratings 34X and 36X and fixed grating 38X. Similar to moving grating 34Y, moving grating 34X has the function of making measurement beam LX1 be diffracted and generating at least two diffraction beams (e.g. ±first order diffraction beams). Similar to moving grating 36Y, moving grating 36X has the function of making the two diffraction beams generated at moving grating 34X be diffracted to generate diffraction beams $LX1_1$ and $LX1_2$, and irradiating diffraction beams $LX1_1$ and $LX1_2$ at substantially the same point on fixed grating 38X.

In this case, when wafer stage WST to which mirror block 30 is fixed is displaced in the measurement direction (X-axis direction) of X encoder 20X, the irradiation point of measurement beam LX1 is displaced on moving grating 34X in its periodic direction (X-axis direction). Further, the irradiation points of the diffraction beams generated at moving grating 34X are displaced on moving grating 36X in its periodic direction (X-axis direction). Accordingly, moving gratings 34X and 36X have also the function of a reference grating that generates the phase difference between diffraction beams $LX1_1$ and $LX1_2$ that are synthesized as synthetic beam LX2, in accordance with the relative displacement in the X-axis direction between wafer stage WST on which moving gratings 34X and 36X are placed and fixed grating 38X.

Meanwhile, even if wafer stage WST is displaced in the X-axis direction, the irradiation points of diffraction beams $LX1_1$ and $LX1_2$ derived from measurement beam LX1 are not displaced on fixed grating 38X in its periodic direction (X-axis direction). Accordingly, fixed grating 38X has only the function of making diffraction beams $LX1_1$ and $LX1_2$ that are irradiated be diffracted, and synthesizing them on a same axis to generate synthetic beam LX2.

As is obvious from the discussion above, in Y encoders $20Y_1$ and $20Y_2$, the diffraction gratings that have the function of the reference grating are placed on stage platform 12 as fixed gratings $38Y_1$ and $38Y_2$. And, in X encoder 20X, the diffraction gratings that have the function of the reference grating are placed on mirror block 30 fixed to wafer stage WST, as moving gratings 34X and 36X.

FIG. 7 shows a main configuration of the control system of exposure apparatus 100. The control system is mainly configured of controller 10 that includes a microcomputer (or a workstation) that performs overall control of the entire apparatus.

In exposure apparatus 100 of the embodiment, in the procedure similar to that in the conventional scanner, controller 10 performs reticle alignment and baseline measurement of alignment system ALG, and wafer alignment such as EGA. Then, based on the wafer alignment results, an exposure operation by a step-and-scan method is performed, and a pattern of reticle R is transferred to a plurality of shot areas on wafer W, respectively. This exposure operation is performed by alternately repeating an inter-shot stepping operation of moving wafer stage WST that holds wafer W to an acceleration starting position for exposure of a next shot area of wafer W, and the scanning exposure operation described above.

During the exposure, controller 10 controls the position of reticle stage RST based on the measurement values of reticle interferometer 116, and also performs position control of wafer stage WST within the XY plane based on the measurement values of each encoder of encoder system 150. Further, controller 10 performs focus-leveling control of wafer W by driving the wafer holder in the Z-axis direction, the θx direction and the θy direction, via the Z-tilt drive mechanism (not shown), based on the measurement values of a focus sensor (not shown).

As is described in detail above, according to exposure apparatus 100 of the embodiment, measurement beams LY1 and LY3 are respectively irradiated from Y encoder units $22Y_1$ and $22Y_1$ of encoder system 150 to moving grating 34Y placed on the side surface of mirror block 30 fixed to wafer stage WST, along the optical paths parallel to the Y-axis. The diffraction beams generated from moving grating 34Y due to the irradiation are respectively irradiated to fixed gratings $38Y_1$ and $38Y_2$ placed on the upper surface of stage platform 12 via moving grating 36Y placed on the bottom surface of mirror block 30, and the diffraction beams respectively generated from fixed gratings $38Y_1$ and $38Y_2$ (to be more precise, synthetic beams LY2 and LY4 of the diffraction beams) are received by (the internal photodetection elements of) Y encoder units $22Y_1$ and $22Y_1$ via mirror block 30. Then, the measurement value of the relative displacement between moving grating 36Y and fixed gratings $38Y_1$ and $38Y_2$ in the Y-axis direction is output from Y encoder units $22Y_1$ and $22Y_1$ to controller 10.

Further, measurement beam LX is irradiated from X encoder unit 22X of encoder system 150 to moving grating 34X placed on the side surface of mirror block 30, along the optical path parallel to the Y-axis. The diffraction beams generated from moving grating 34X due to the irradiation are irradiated to fixed grating 38X placed on the upper surface of stage platform 12 via moving grating 36X placed on the bottom surface of mirror block 30, and the diffraction beams respectively generated from fixed grating 38X (to be more precise, synthetic beam LX2 of the diffraction beams) are received by (the internal photodetection element of) X encoder unit 22X via mirror block 30. Then, the measurement value of the relative displacement between moving gratings 34X and 36X and fixed grating 38X in the X-axis direction is output from X encoder unit 22X to controller 10.

Accordingly, controller 10 can measure the Y-position, the rotation in the θz direction, and the X-position of wafer stage WST, based on the measurement values of the relative displacements from Y encoder units $22Y_1$ and $22Y_2$ and X encoder unit 22X.

In this case, in Y encoders $20Y_1$ and $20Y_2$, fixed gratings $38Y_1$ and $38Y_2$ placed on the upper surface of stage platform 12 have the function of the reference grating that generates the phase difference between the ±first order diffraction beams ($LY1_1$ and $LY1_2$) generated from fixed gratings $38Y_1$ and $38Y_2$, in accordance with the relative displacement between moving grating 36Y (i.e. wafer stage WST) and fixed gratings $38Y_1$ and $38Y_2$ in the Y-axis direction. And, in X encoder 20X, moving gratings 34X and 36X placed on mirror block 30 fixed to wafer stage WST have the function of the reference grating that generates the phase difference between the diffraction beams $LX1_1$ and $LX1_2$ that are synthesized as synthetic beam LX2, in accordance with the relative displacement between moving gratings 34X and 36X (i.e. wafer stage WST) and fixed grating 38X in the X-axis direction.

In this case, fixed gratings $38Y_1$ and $38Y_2$ are placed at positions that are the same distance apart in the −X direction and the +X direction from the Y-axis orthogonal to optical axis AX of projection optical system PL, on straight lines (axes) parallel to the Y-axis, and therefore, by using the average value of the measurement values of Y encoder units $22Y_1$ and $22Y_2$, high-precision position measurement of wafer sage WST without the Abbe error becomes possible in a direction parallel to the Y-axis direction. Meanwhile, moving grating 36X is placed on a straight line parallel to the X-axis that passes through substantially the center of gravity of wafer stage WST. Accordingly, with respect to a direction parallel to the X-axis, the position of wafer stage WST can be measured in the vicinity of the center of gravity of wafer stage WST, and hence the high-precision position control of wafer stage WST becomes possible by the drive of the center of gravity.

Further, all of measurement beams LY1, LY3 and LX that are used for position measurement of wafer stage WST in the Y-axis direction and the X-axis direction are irradiated along the optical paths parallel to the Y-axis to moving gratings 34Y and 34X, respectively, which are placed on mirror block 30 in common attached to wafer stage WST, and therefore, it becomes possible to make the measurement points of position measurement of wafer stage WST in directions parallel to the Y-axis and the X-axis respectively be close to each other. Accordingly, a space where encoder system 150 occupies can be decreased.

Further, according to the embodiment, high-precision position measurement, and hence position control of wafer stage WST becomes possible by using encoder system 150 described above. Accordingly, it becomes possible to transfer patterns of reticle R to a plurality of shot areas on wafer W with high precision.

Incidentally, the configurations of Y encoders $20Y_1$ and $20Y_2$ and X encoder 20X, and the like in the embodiment above are examples, and the present invention is not limited thereto. Several modified examples of the embodiment above are described below, focusing on the encoder system. Incidentally, in the following modified examples, the cases are described where not a pair of Y encoders but only one Y encoder is arranged, for the sake of simplification of the description and for the sake of convenience in illustration.

First Modified Example

Figure 8A:
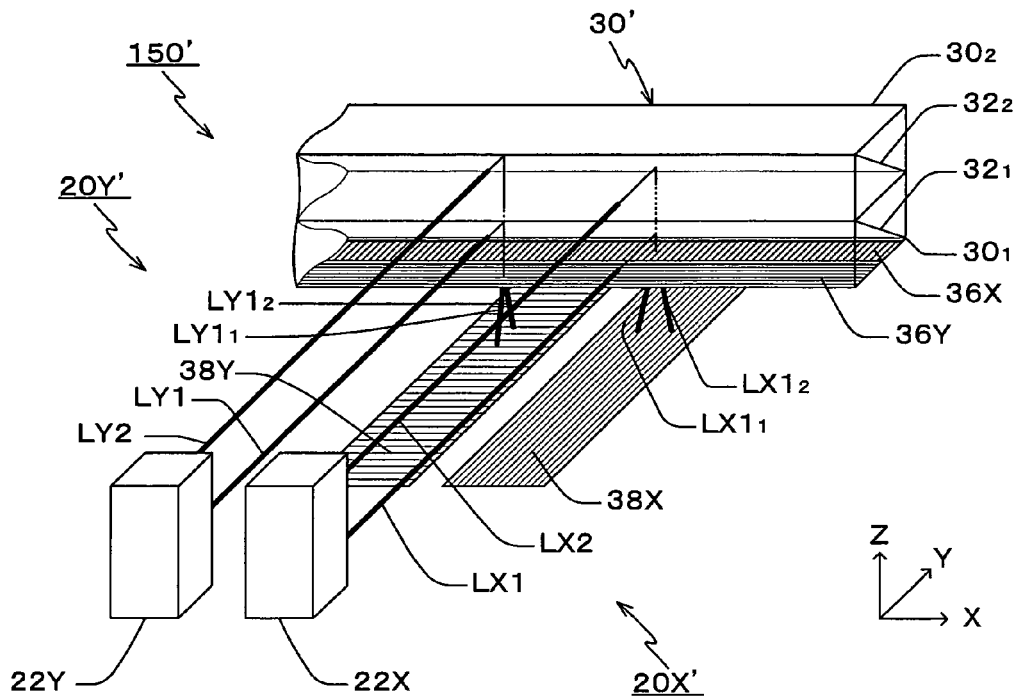
FIGS. 8A and 8B are views used to explain a first modified example of the encoder system.
Figure 8B:
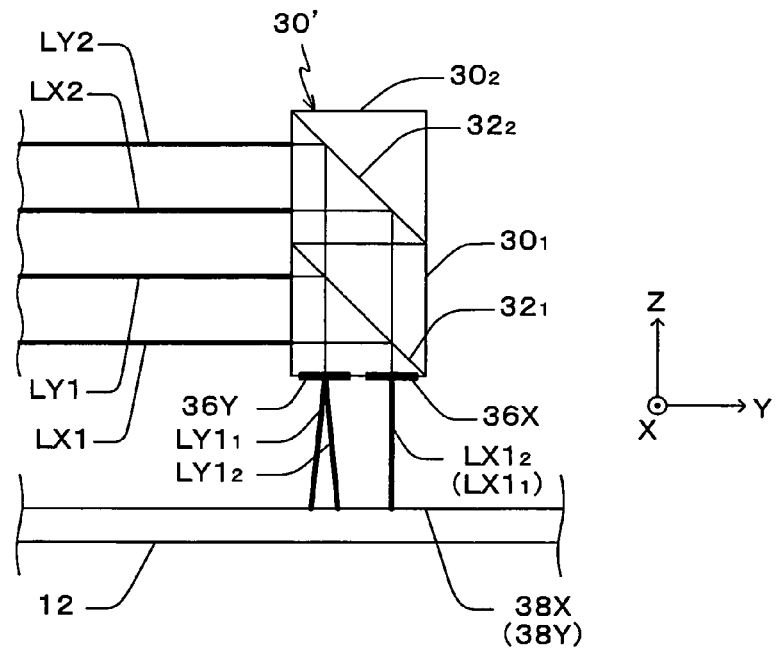

FIGS. 8A and 8B show a configuration of an encoder system 150' in a first modified example that includes a Y encoder 20Y' and an X encoder 20X'. FIG. 8A also shows the inside of a mirror block 30' except for a part thereof. As shown in FIGS. 8A and 8B, mirror block 30' is equivalent to a mirror block which is obtained by removing moving gratings 34Y and 34X placed on the −Y side surface of block $30_1$ from mirror block 30 related to the embodiment above (i.e. on which moving gratings 34Y and 34X are not arranged).

In this example, it is assumed that mirror block 30' is attached (fixed) to the bottom surface (lower surface) of wafer stage WST, instead of mirror block 30 described previously. And, the optical path of measurement beam LY1 emitted from Y encoder unit 22Y coincides with the Y-axis orthogonal to the optical axis of projection optical system PL, and the optical path of measurement beam LX1 emitted from X encoder unit 22X is positioned on the +X side of the optical path of measurement beam LY1. Further, corresponding to the optical paths of measurement beams LY1 and LX1, fixed gratings 38Y and 38X are placed on the stage platform, similar to the previously described case. This can be said for each of the modified examples below.

According to Y encoder 20' in this example, measurement beam LY1 emitted from encoder unit 22Y is transmitted through mirror block 30' and is reflected off reflection surface $32_1$, and its optical path is deflected in the −Z direction and measurement beam LY1 is irradiated to moving gratings 36Y. Accordingly, a plurality of diffraction beams whose diffraction angles are different in the YZ plane are generated at moving grating 36Y. In FIGS. 8A and 8B, ±first order diffraction beams $LY1_1$ and $LY1_2$ are shown. Diffraction beams $LY1_1$ and $LY1_2$ are irradiated to fixed grating 38Y, and accordingly, a plurality of diffraction beams derived from diffraction beams $LY1_1$ and $LY1_2$ are generated from fixed grating 38Y. In this case, a −first order diffraction beam derived from diffraction beam $LY1_1$ and a +first order diffraction beam derived from diffraction beam $LY1_2$ inversely trace the optical paths of the original diffraction beams and are converged (synthesized) on a same axis parallel to the Z-axis at moving grating 36Y to be synthetic beam LY2. Synthetic beam LY2 is transmitted through reflection surface $32_1$, and then is reflected off total reflection surface $32_2$ and its optical path is deflected in the −Y direction, and synthetic beam LY2 is emitted from the −Y side surface of mirror block 30' as an output beam. Then, synthetic beam LY2 returns to encoder unit 22Y along the optical path parallel to the Y-axis, and is received by a photodetection element (not shown) within encoder unit 22Y, and its intensity is measured. And, encoder unit 22Y obtains the relative displacement between moving grating 36Y and fixed grating 38Y in the Y-axis direction based on the intensity variation of synthetic beam (output beam) LY2, in a manner similar to the previously-described manner, and the measurement value is output to controller 10.

Further, according to X encoder 20X' of this example, measurement beam LX1 emitted from encoder unit 22X is transmitted through mirror block 30' and is reflected off reflection surface $32_1$, and its optical path is deflected in the −Z direction and measurement beam LX1 is irradiated to moving grating 36X. Accordingly, a plurality of diffraction beams whose diffraction angles are different in the XZ plane are generated from moving grating 36X. In FIGS. 8A and 8B, +first order diffraction beams $LX1_1$ and $LX1_2$ are shown. However, in FIG. 8B, these diffraction beams overlap with each other in a direction orthogonal to the page surface (the depth direction).

Diffraction beams $LX1_1$ and $LX1_2$ are irradiated to fixed grating 38X. Due to this irradiation, a plurality of diffraction beams derived from diffraction beams $LX1_1$ and $LX1_2$ are generated from fixed grating 38X. In this case, a −first order diffraction beam derived from diffraction beam $LX1_1$ and a +first order diffraction beam derived from diffraction beam $LX1_2$ inversely trace the optical paths of the original diffraction beams, and converged (synthesized) on a same axis parallel to the Z-axis at moving grating 36X to be a synthetic beam LX2. Synthetic beam LX2 is transmitted through reflection surface $32_1$, and then is reflected off total reflection surface $32_2$ and its optical path is deflected in the −Y direction, and synthetic beam LX2 is emitted from the −Y side surface of mirror block 30' as an output beam. Then, synthetic beam LX2 returns to encoder unit 22X along the optical path parallel to the Y-axis, and is received by a photodetection element (not shown) within encoder unit 22X, and its intensity is measured. And, encoder unit 22X obtains the relative displacement between moving grating 36X and fixed grating 38X in the X-axis direction based on the intensity variation of synthetic beam (output beam) LX2, in a manner similar to the previously-described manner, and the measurement value is output to controller 10.

In this example, based on the wavelength of measurement beam LY1, the pitches of moving grating 36Y and fixed grating 38Y are set so that the −first order diffraction beam derived from diffraction beam $LY1_1$, and the +first order diffraction beam derived from diffraction beam $LY1_2$ inversely trace the optical paths of the original diffraction beams. Similarly, based on the wavelength of measurement beam LX1, the pitches of moving grating 36X and fixed grating 38X are set so that the −first order diffraction beam derived from diffraction beam $LX1_1$ and the +first order diffraction beam derived from diffraction beam $LX1_2$ inversely trace the optical paths of the original diffraction beams.

Encoder system 150' including Y encoder 20Y' and X encoder 20X' described above cannot measure the θz rotation of wafer stage WST, but except for this point, encoder system 150' has the function similar to that of encoder system 150 in the embodiment above. It is also possible that a pair of Y encoders 20Y' are provided so as to be capable of measuring the θz rotation of wafer stage WST.

Second Modified Example

Figure 9A:
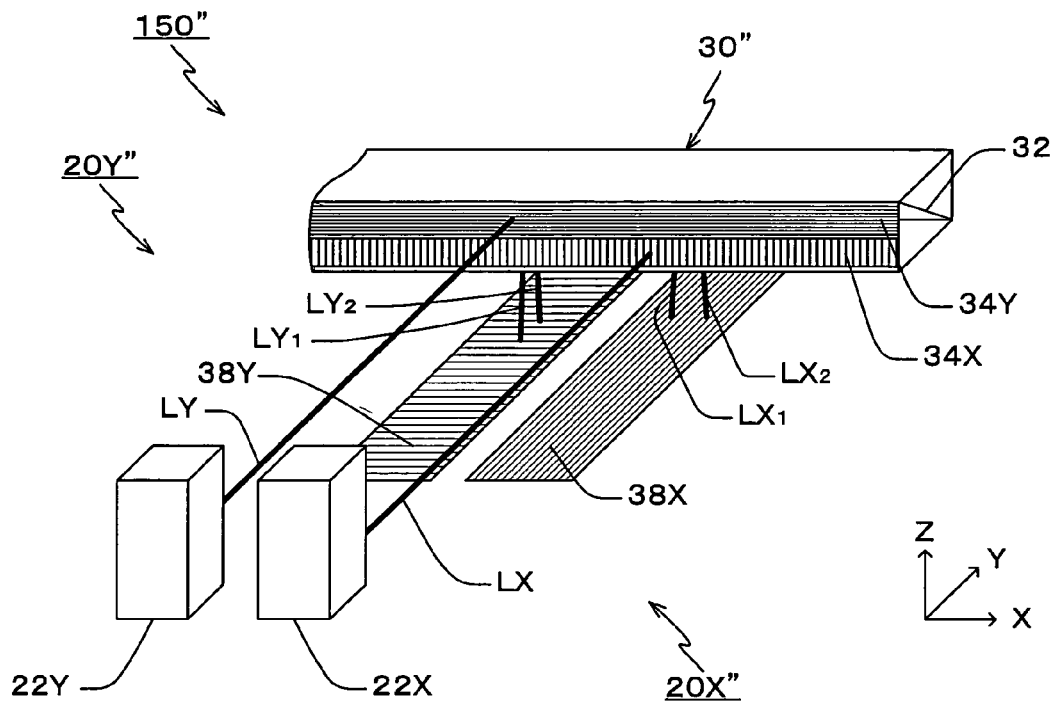
FIGS. 9A and 9B are views used to explain a second modified example of the encoder system.
Figure 9B:
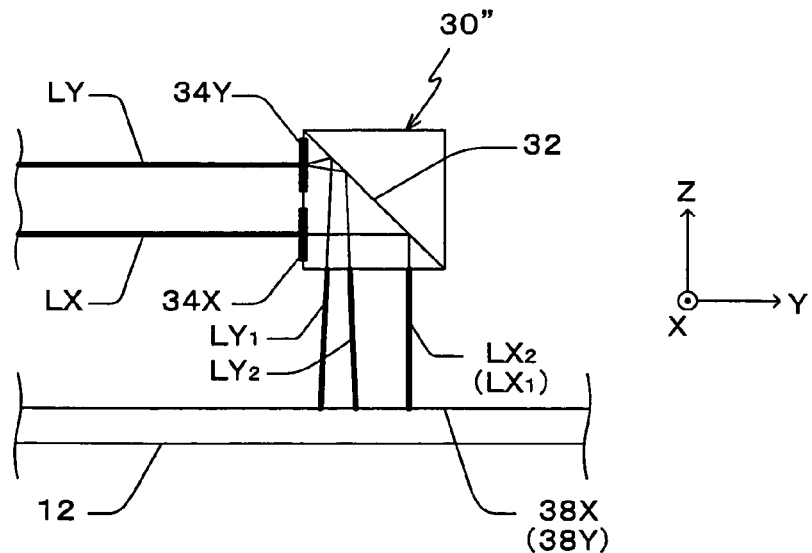

FIGS. 9A and 9B show a configuration of an encoder system 150" related to a second modified example, which includes a Y encoder 20Y" and an X encoder 20X". As shown in FIGS. 9A and 9B, mirror block 30" is equivalent to a mirror block which is obtained by removing moving gratings 36Y and 36X placed on the −Z side surface of block 30$_1$ that constitutes mirror block 30 related to the embodiment above (i.e. on which moving gratings 36Y and 36X are not arranged).

In this example, it is assumed that mirror block 30" is attached (fixed) to the lower section of wafer stage WST, instead of mirror block 30 described earlier.

According to Y encoder 20Y" of this example, measurement beam (input beam) LY emitted from encoder unit 22Y is perpendicularly irradiated to moving grating 34Y placed on the −Y side surface of mirror block 30". With this irradiation, a plurality of diffraction beams whose diffraction angles are different within the YZ plane are generated from moving grating 34Y. In FIGS. 9A and 9B, ±first order diffraction beams LY$_1$ and LY$_2$ are shown. These diffraction beams LY$_1$ and LY$_2$ are transmitted through mirror block 30", and are reflected off reflection surface 32, and the optical paths are deflected in the −Z direction, and then diffraction beams LY$_1$ and LY$_2$ are emitted from mirror block 30" and irradiated to fixed grating 38Y. With this irradiation, a plurality of diffraction beams derived from diffraction beams LY$_1$ and LY$_2$ are generated from fixed grating 38Y. In this case, a −first order diffraction beam derived from diffraction beam LY$_1$ and a +first order diffraction beam derived from diffraction beam LY$_2$ inversely trace the optical paths of the original diffraction beams, and are reflected off reflection surface 32 and their optical paths are deflected in the −Y direction, and the ±first order diffraction beams are converged (synthesized) on a same axis parallel to the Y-axis at moving grating 34Y to be a synthetic beam LY. Synthetic beam LY is emitted from the −Y side surface of mirror block 30" as an output beam. Then, synthetic beam LY returns to encoder unit 22Y along the optical path of measurement beam (input beam) LY emitted from encoder unit 22Y. And, within encoder unit 22Y, synthetic beam LY is split from measurement beam (input beam) LY via the beam splitter, and is received by a photodetection element (not shown), and its intensity is measured. And, encoder unit 22Y obtains the relative displacement between moving grating 34Y and fixed grating 38Y in the Y-axis direction based on the intensity variation of synthetic beam (output beam) LY, in a manner similar to the previously-described manner, and the measurement value is output to controller 10.

According to X encoder 20X" of this example, measurement beam (input beam) LX emitted from encoder unit 22X is perpendicularly irradiated to moving grating 34X arranged on mirror block 30". With this irradiation, a plurality of diffraction beams whose diffraction angles are different within the XY plane are generated from moving grating 34X. In FIGS. 9A and 9B, ±first order diffraction beams LX$_1$ and LX$_2$ are shown. In FIG. 9(B), however, these diffraction beams overlap with each other in a direction orthogonal to the page surface (a depth direction). These diffraction beams LX$_1$ and LX$_2$ are transmitted through mirror block 30", and are reflected off reflection surface 32, and the optical paths are deflected in the −Z direction, and then diffraction beams LX$_1$ and LY$_2$ are emitted from mirror block 30" and irradiated to fixed grating 38X. With this irradiation, a plurality of diffraction beams derived from diffraction beams LX$_1$ and LX$_2$ are generated from fixed grating 38X. In this case, a −first order diffraction beam derived from diffraction beam LX$_1$ and a +first order diffraction beam derived from diffraction beam LX$_2$ inversely trace the optical paths of the original diffraction beams, and are reflected off reflection surface 32 and their optical paths are deflected in the −Y direction, and the ±first order diffraction beams are converged (synthesized) on a same axis parallel to the Y-axis at moving grating 34X, and emitted from the −Y side surface of mirror block 30" as synthetic beam LX. Then, synthetic beam LY returns to encoder unit 22X along the optical path of measurement beam (input beam) LX. And within encoder unit 22X, synthetic beam LX is split from measurement beam (input beam) LX via the beam splitter, and is received by a photodetection element (not shown), and its intensity is measured. And, encoder unit 22X obtains the relative displacement between moving grating 34X and fixed grating 38X in the X-axis direction based on the intensity variation of synthetic beam (output beam) LX, in a manner similar to the previously-described manner, and the measurement value is output to controller 10.

In this example, based on the wavelength of measurement beam LY, the pitches of fixed grating 38Y and moving grating 34Y are set so that the −first order diffraction beam derived from diffraction beam LY$_1$ and the +first order diffraction beam derived from diffraction beam LY$_2$ inversely trace the optical paths of the original diffraction beams. Similarly, based on the wavelength of measurement beam LX, the pitches of fixed grating 38X and moving grating 34X are set so that the −first order diffraction beam derived from diffraction beam LX$_1$ and the +first order diffraction beam derived from diffraction beam LX$_2$ inversely trace the optical paths of the original diffraction beams.

Encoder system 150" configured of Y encoder 20Y" and X encoder 20X" described above cannot measure the θz rotation of wafer stage WST, but except for this point, encoder system 150" has the function similar to that of encoder system 150 in the embodiment above. It is also possible that a pair of Y encoders 20Y" are provided so as to be capable of measuring the θz rotation of wafer stage WST.

Similar to Y encoder 20Y and X encoder 20X in the embodiment described earlier, also in Y encoder 20Y' and X encoder 20X' in the first modified example described above, and Y encoder 20Y" and X encoder 20X" in the second modified example described above, the functions of the moving grating and the fixed grating are different. More specifically, in the first modified example, fixed grating 38Y has the function as a reference grating in Y encoder 20Y' and moving grating 36X has the function as a reference grating in X encoder 20X'. In the second modified example, fixed grating 38Y has the function as a reference grating in Y encoder 20Y" and moving grating 34X has the function as a reference grating in X encoder 20X".

Third Modified Example

In the first and second modified examples described above, fixed grating 38X has only the function of making two diffraction beams (±first order diffraction beams) generated at the moving grating (36X or 34X) be diffracted and making two diffraction beams of a plurality of diffraction beams generated due to the diffraction inversely trace the optical paths of the original diffraction beams to make them be synthesized on the same axis at the moving grating (36X or 34X). Accordingly, instead of fixed grating 38X, a pair of reflection surfaces that perpendicularly reflect the two diffraction beams (±first order diffraction beams), respectively, generated at the moving grating (36X or 34X) can be used.

Figure 10A:
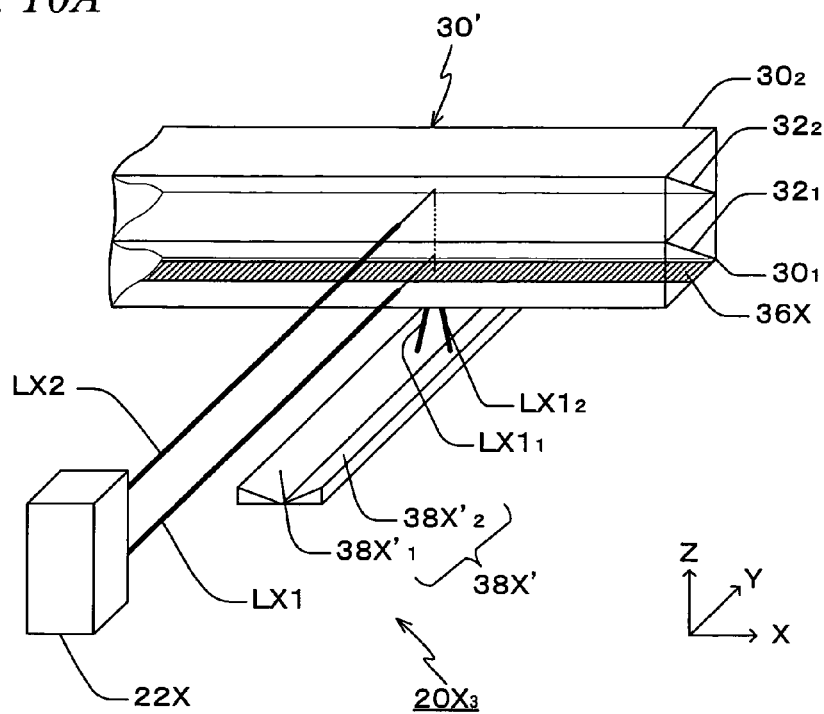
FIGS. 10A and 10B are views used to explain a third modified example of the encoder system.
Figure 10B:
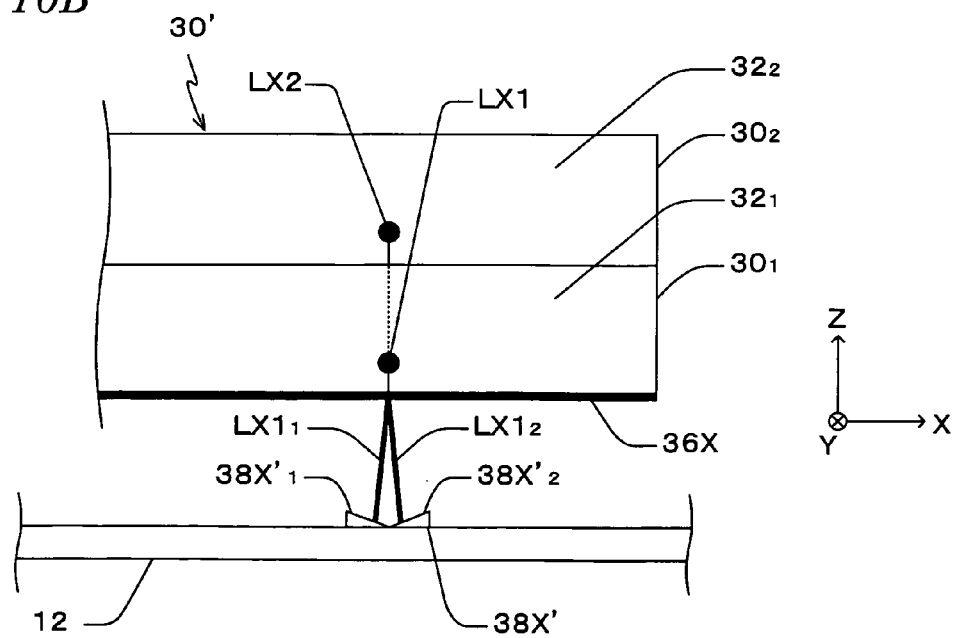

FIGS. 10A and 10B show an X encoder 20X$_3$ related to a third modified example, in which a reflection member 38X' is arranged instead of fixed grating 38X in the first modified example described above. The Y encoder and other sections are omitted in FIGS. 10A and 10B.

On reflection member 38X', two reflection surfaces 38X'$_1$ and 38X'$_2$ are arranged that are respectively orthogonal to diffraction beams LX1$_1$ and LX1$_2$ generated at moving grating 36X. Incidentally, in the second modified example described above, reflection member 38X' can be arranged instead of fixed grating 38X. In this case, two reflection surfaces 38X'$_1$ and 38X'$_2$ are set to be respectively orthogonal to diffraction beams LX$_1$ and LX$_2$ generated at moving grating 34X.

X encoder 20X$_3$ in the third modified example has the function similar to the function of X encoder 20X' in the first modified example (or X encoder 20X" in the second modified example). It is also possible that encoder units 22Y and 22X are configured as one encoder unit. In this case, a compact position measuring system can be configured.

Incidentally, in the embodiment and the first and third modified examples described above, although mirror block 30 (or 30') is configured of two blocks 30$_1$ and 30$_2$, a mirror block can be configured of two reflection surfaces 32$_1$ and 32$_2$ arranged within one block. Or, a mirror block can be configured of a hollow member in which a section other than diffraction gratings and reflection surfaces is a space. Further, in the embodiment above and the like, it is also possible to make reflection and transmittance of the measurement beams be efficiently performed, by using a beam having a straight line polarization as each measurement beam and constituting a mirror block by, for example, combining a polarization beam splitter and a ¼ wavelength plate.

Further, in the embodiment and each of the modified examples described above, although the case has been described where the ±first order diffraction beams of a plurality of diffraction beams generated from the moving grating and the fixed grating are used, this is not intended to be limiting, and it is also possible to use a combination of diffraction beams of the arbitrary same order (±second order, ±third order, and so on) except for the 0-th order, or of diffraction beams generated in a same direction. In this case, however, it is necessary to make the combination of such diffraction beams function similarly to the ±first order diffraction beams in the embodiment and each of the modified examples described above, by determining the pitch of each grating in accordance with the wavelength of the measurement beam and, if necessary, appropriately setting the positional relation between the gratings.

Further, in the embodiment and each of the modified examples described above, the case has been described where the mirror block is fixed to the bottom surface (lower surface) of wafer stage WST and the fixed grating is arranged below the mirror block, that is, on the upper surface of stage platform 12, but this is not intended to be limiting, and it is also possible that the mirror block (optical member) is attached to the upper surface of wafer stage WST and the fixed grating is placed above the mirror block, for example, on the lower surface of the main frame (metrology frame) that holds the projection optical system. More specifically, the position of wafer stage WST can be measured, by employing an encoder system which is like the encoder system in the embodiment and each of the modified examples described above that is vertically inverted.

Further, in the embodiment and each of the modified examples described above, only an encoder system is arranged and an interferometer system does not necessarily have to be arranged.

Incidentally, in the embodiment above, the case has been described where the present invention is applied to a dry-type exposure apparatus that performs exposure of wafer W without a liquid (e.g. pure water), but this is not intended to be limiting, and the present invention can also be applied to an exposure apparatus in which a liquid immersion space including an optical path of an illumination light is formed in a space between a projection optical system and a wafer and the wafer is exposed with the illumination light via the projection optical system and the liquid immersion space, as is disclosed in, for example, International Publication No. 99/49504, European Patent Application Publication No. 1 420 298, International Publication No. 2004/055803, Kokai (Japanese Unexamined Patent Application Publication) No. 2004-289126 (the corresponding U.S. Pat. No. 6,952,253), and the like.

Further, in the embodiment above, the case has been described where the present invention is applied to a scanning exposure apparatus by a step-and-scan method or the like, but this is not intended to be limiting, and the present invention can also be applied to a static exposure apparatus such as a stepper. Even with the stepper or the like, the position of a stage on which an object subject to exposure is mounted can be measured using the encoders, similar to the embodiment above, an equivalent effect can be obtained. Further, the present invention can also be applied to a reduced projection exposure apparatus by a step-and-stitch method that synthesizes a shot area and a shot area, an exposure apparatus by a proximity method, a mirror projection aligner, or the like. Furthermore, the present invention can also be applied to a multi-stage type exposure apparatus equipped with a plurality of wafer stages, as is disclosed in, for example, U.S. Pat. No. 6,590,634, U.S. Pat. No. 5,969,441, U.S. Pat. No. 6,208,407, and the like. Further, the present invention can also be applied to an exposure apparatus equipped with a measurement stage, which includes measurement members (e.g. a fiducial mark and/or a sensor), separately from a wafer stage, as is disclosed in, for example, International Publication No. 2005/074014 and the like.

Further, the magnification of the projection optical system in the exposure apparatus of the embodiment above is not only a reduction system, but also can be either an equal magnifying system or a magnifying system, and projection optical system PL is not only a dioptric system, but also can be either a catoptric system or a catadioptric system, and in addition, the projected image can be either an inverted image or an upright image. Further, the illumination area and exposure area described earlier have a rectangular shape, but the shape is not limited to rectangular, and can also be circular arc, trapezoidal, parallelogram or the like.

Incidentally, a light source of the exposure apparatus in the embodiment above is not limited to the ArF excimer laser, but a pulsed laser light source such as a KrF excimer laser (output wavelength: 248 nm), an F$_2$ laser (output wavelength: 157 nm), an Ar$_2$ laser (output wavelength: 126 nm) or a Kr$_2$ laser (output wavelength: 146 nm), or an extra-high pressure mercury lamp that generates an emission line such as a g-line (wavelength: 436 nm) or an i-line (wavelength: 365 nm) can also be used. Further, a harmonic wave generating device of a YAG laser or the like can also be used. Besides the light sources above, as is disclosed in, for example, U.S. Pat. No. 7,023,610, a harmonic wave, which is obtained by amplifying a single-wavelength laser beam in the infrared or visible range emitted by a DFB semiconductor laser or fiber laser as vacuum ultraviolet light, with a fiber amplifier doped with, for example, erbium (or both erbium and ytterbium), and by converting the wavelength into ultraviolet light using a nonlinear optical crystal, can also be used.

Further, illumination light IL of the exposure apparatus is not limited to the light having a wavelength more than or equal to 100 nm, and it is needless to say that the light having a wavelength less than 100 nm can be used. For example, the present invention can also be applied to an EUV (Extreme Ultraviolet) exposure apparatus that uses an EUV light in a soft X-ray range (e.g. a wavelength range from 5 to 15 nm). Besides such an apparatus, the present invention can also be applied to an exposure apparatus that uses charged particle beams such as an electron beam or an ion beam.

Further, in the embodiment above, a transmissive type mask (reticle), which is a transmissive substrate on which a predetermined light shielding pattern (or a phase pattern or a light attenuation pattern) is formed, is used. Instead of this reticle, however, as is disclosed in, for example, U.S. Pat. No. 6,778,257, it is also possible to use an electron mask (which is also called a variable shaped mask, an active mask or an image generator, and includes, for example, a DMD (Digital Micromirror Device) that is a type of a non-emission type image display device (spatial light modulator) or the like) on which a light-transmitting pattern, a reflection pattern, or an emission pattern is formed according to electronic data of the pattern that is to be exposed.

Further, the present invention can also be applied to an exposure apparatus (lithography system) that forms line-and-space patterns on a wafer by forming interference fringes on the wafer.

Moreover, the present invention can also be applied to an exposure apparatus that synthesizes two reticle patterns on a wafer via a projection optical system and almost simultaneously performs double exposure of one shot area on the wafer by one scanning exposure, as is disclosed in, for example, U.S. Pat. No. 6,611,316.

Further, an apparatus that forms a pattern on an object is not limited to the exposure apparatus (lithography system) described previously, but for example, the present invention can also be applied to an apparatus that forms a pattern on an object by an ink-jet method.

Incidentally, an object on which a pattern should be formed (an object subject to exposure to which an energy beam is irradiated) in the embodiment above is not limited to a wafer, but can be other objects such as a glass plate, a ceramic substrate, a film member, or a mask blank.

The use of the exposure apparatus is not limited to the exposure apparatus for manufacturing semiconductor devices, but the present invention can also be widely applied, for example, to an exposure apparatus for liquid crystal display devices that transfers a liquid crystal display device pattern onto a rectangular glass plate, and an exposure apparatus for producing organic ELs, thin-film magnetic heads, imaging devices (such as CCDs), micromachines, DNA chips, and the like. Further, the present invention can be applied not only to an exposure apparatus for producing microdevices such as semiconductor devices, but can also be applied to an exposure apparatus that transfers a circuit pattern onto a glass substrate or silicon wafer to produce a reticle or a mask used in a light exposure apparatus, an EUV exposure apparatus, an X-ray exposure apparatus, an electron-beam exposure apparatus, and the like.

Incidentally, the movable body apparatus of the present invention can be applied not only to the exposure apparatus, but can also be applied widely to other substrate processing apparatuses (such as a laser repair apparatus, a substrate inspection apparatus and the like), or to apparatuses equipped with a movable body such as a stage that moves within a two-dimensional plane such as a position setting apparatus of a sample or a wire bonding apparatus in other precision machines.

Incidentally, the above disclosures of all the publications (including the International Publications), and the specifications of the U.S. patent application Publications and the U.S. patents related to exposure apparatuses and the like that are cited in the description above are each incorporated herein by reference.

Electron devices such as semiconductor devices are manufactured through the following steps: a step where the function/performance design of a device is performed; a step where a reticle is manufactured based on this design step; a step where a wafer is manufactured from silicon materials; a lithography step where a pattern of the mask (reticle) is transferred onto the wafer by the exposure apparatus (pattern forming apparatus) of the embodiment described previously; a development step where the exposed wafer is developed; an etching step where an exposed member of an area other than an area where resist remains is removed by etching; a resist removing step where the resist that is no longer necessary when the etching is completed is removed; a device assembly step (including a dicing process, a bonding process, and a packaging process); an inspection step; and the like. In this case, in the lithography step, the exposure method described earlier is executed by using the exposure apparatus of the embodiment above and the device patterns are formed on the wafer, and therefore, the devices with high integration can be manufactured with good productivity.

While the above-described embodiment of the present invention is the presently preferred embodiment thereof, those skilled in the art of lithography systems will readily recognize that numerous additions, modifications, and substitutions may be made to the above-described embodiment without departing from the spirit and scope thereof. It is intended that all such modifications, additions, and substitutions fall within the scope of the present invention, which is best defined by the claims appended below.

What is claimed is:

1. A position measuring system that measures positional information of a movable body that moves along a predetermined plane including a first axis and a second axis that are orthogonal to each other, the system comprising:

a first fixed grating and a second fixed grating that are respectively arranged external to the movable body so as to extend in a direction parallel to the first axis, the first fixed grating having its periodic direction in the direction parallel to the first axis and the second fixed grating having its periodic direction in a direction parallel to the second axis;

an optical member that has a first moving grating and a second moving grating and is attached to the movable body, the first and second moving gratings having their periodic directions in directions corresponding to the periodic directions of the first fixed grating and the second fixed grating respectively; and a first photodetection system and a second photodetection system that correspond to the first and second fixed gratings respectively, whereby a first measurement device that measures positional information of the movable body in the direction parallel to the first axis is configured including the first fixed grating, the first moving grating and the first photodetection system, and a second measurement device that measures positional information of the movable body in the direction parallel to the second axis is configured including the second fixed grating, the second moving grating and the second photodetection system, wherein a first measurement beam and a second measurement beam, which reach the optical member, are irradiated on the first moving grating and the second moving grating, respectively, the first measurement beam and the second measurement beam reaching the optical member along a first optical path and a second optical path that are parallel to the first axis and correspond to the first fixed grating and the second fixed grating, respectively.

2. The position measuring system according to claim 1, wherein
the optical member has its longitudinal direction in the direction parallel to the second axis, and has a length in the longitudinal direction that is longer than or equal to about a length of the movable body in the direction parallel to the second axis.

3. The position measuring system according to claim 1, wherein
the first and second moving gratings are placed on a surface of the optical member.

4. The position measuring system according to claim 3, wherein
the optical member further has a third moving grating and a fourth moving grating that are respectively placed on another surface that is different from the surface, the third and fourth moving gratings having their periodic directions in directions corresponding to the periodic directions of the first and second fixed gratings, respectively.

5. The position measuring system according to claim 1, wherein
the first and second fixed gratings are placed on a surface that is opposed to the movable body and parallel to the predetermined plane.

6. The position measuring system according to claim 5, wherein the first and second fixed gratings are placed apart in the direction parallel to the second axis.

7. The position measuring system according to claim 1, wherein
the first and second fixed gratings each have a length that is longer than or equal to about a movement stroke of the movable body in the direction parallel to the first axis.

8. The position measuring system according to claim 1, wherein
the first measurement device further includes a third fixed grating that is arranged external to the movable body so as to extend in the direction parallel to the first axis and has its periodic direction in the direction parallel to the first axis and a third photodetection system corresponding to the third fixed grating, and further measures positional information of the movable body in a rotational direction around a third axis orthogonal to the predetermined plane based on an output of the first photodetection system and an output of the third photodetection system.

9. A movable body apparatus, comprising:
a movable body that moves along a predetermined plane including a first axis and a second axis that are orthogonal to each other;
the position measuring system according to claim 1 that measures positional information of the movable body within the predetermined plane; and
a drive device that drives the movable body along the predetermined plane based on the positional information of the movable body that has been measured by the position measuring system.

10. The movable body apparatus according to claim 9, wherein
the optical member that constitutes a part of the position measuring system is attached near a center of gravity of the movable body.

11. An exposure apparatus that forms a pattern on an object by irradiating the object with an energy beam, the apparatus comprising:
the movable body apparatus according to claim 9 that drives a movable body that holds the object along a predetermined plane in order to form the pattern.

12. A device manufacturing method, comprising:
a process of forming a pattern on an object by using the exposure apparatus according to claim 11; and
a process of applying processing to the object on which the pattern has been formed.

13. A pattern forming apparatus that forms a pattern on an object, the apparatus comprising:
a movable body that can move while holding the object;
a pattern generating device that forms the pattern on the object; and
the movable body apparatus according to claim 9 that drives the movable body within a predetermined plane.

14. The pattern forming apparatus according to claim 13, wherein
the object has a sensitive layer, and
the pattern generating device forms the pattern by irradiating the sensitive layer with an energy beam.

15. A device manufacturing method, comprising:
a process of forming a pattern on an object by using the pattern forming apparatus according to claim 13; and
a process of applying processing to the object on which the pattern has been formed.

16. A position measuring system that measures positional information of a movable body that moves along a predetermined plane including a first axis and a second axis that are orthogonal to each other, the system comprising:
a first measurement device which includes a first reference grating that is arranged external to the movable body so as to extend in a direction parallel to the first axis and has its periodic direction in the direction parallel to the first axis, a first diffraction grating that is arranged on the movable body and has its periodic direction in a direction corresponding to the periodic direction of the first reference grating, and a first photodetection system that corresponds to the first reference grating, and which measures positional information of the movable body in the direction parallel to the first axis; and
a second measurement device which includes a second reference grating that is arranged on the movable body and has its periodic direction in a direction parallel to the second axis, a second diffraction grating that is arranged external to the movable body so as to extend in the direction parallel to the first axis and has its periodic direction in a direction corresponding to the periodic direction of the second reference grating, and a second photodetection system that corresponds to the second reference grating, and which measures positional information of the movable body in the direction parallel to the second axis, wherein
a first measurement beam and a second measurement beam, which reach the movable body, are irradiated on the first diffraction grating and the second reference grating, respectively, the first measurement beam and the second measurement beam reaching the movable body along a first optical path and a second optical path that are parallel to the first axis and correspond to the first reference grating and the second diffraction grating, respectively.

17. The position measuring system according to claim 16, wherein
the first diffraction grating and the second reference grating have their longitudinal directions in the direction parallel to the second axis, and each have a length in the longitudinal direction that is longer than or equal to about a length of the movable body in the direction parallel to the second axis.

18. The position measuring system according to claim 16, wherein
the first measurement device further includes a third diffraction grating that is placed at a location different from a location where the first diffraction grating and the second reference grating are arranged on the movable body, and has its periodic direction in a direction corresponding to the periodic direction of the first reference grating, and
the second measurement device further includes a fourth diffraction grating that is placed at a location different from a location where the first diffraction grating and the second reference grating are arranged on the movable body, and has its periodic direction in a direction corresponding to the periodic direction of the second reference grating.

19. The position measuring system according to claim 16, wherein
the first reference grating and the second diffraction grating are placed on a surface that is opposed to the movable body and parallel to the predetermined plane.

20. The position measuring system according to claim 19, wherein
the first reference grating and the second diffraction grating are placed apart in the direction parallel to the second axis.

21. The position measuring system according to claim 16, wherein
the first reference grating and the second diffraction grating each have a length that is longer than or equal to about a movement stroke of the movable body in the direction parallel to the first axis.

22. The position measuring system according to claim 16, wherein
the first measurement device further includes a third reference grating that is arranged external to the movable body so as to extend in the direction parallel to the first axis and has its periodic direction in the direction parallel to the first axis and a third photodetection system corresponding to the third reference grating, and further measures positional information of the movable body in a rotational direction around a third axis orthogonal to the predetermined plane based on an output of the first photodetection system and an output of the third photodetection system.

23. A movable body apparatus, comprising:
a movable body that moves along a predetermined plane including a first axis and a second axis that are orthogonal to each other;
the position measuring system according to claim 16 that measures positional information of the movable body within the predetermined plane; and
a drive device that drives the movable body along the predetermined plane based on the positional information of the movable body that has been measured by the position measuring system.

24. The movable body apparatus according to claim 23, wherein
the first diffraction grating and the second reference grating that constitute a part of the position measuring system are arranged near a center of gravity of the movable body.

25. An exposure apparatus that forms a pattern on an object by irradiating the object with an energy beam, the apparatus comprising:
the movable body apparatus according to claim 23 that drives a movable body that holds the object along a predetermined plane in order to form the pattern.

26. A device manufacturing method, comprising:
a process of forming a pattern on an object by using the exposure apparatus according to claim 25; and
a process of applying processing to the object on which the pattern has been formed.

27. A pattern forming apparatus that forms a pattern on an object, the apparatus comprising:
a movable body that can move while holding the object;
a pattern generating device that forms the pattern on the object; and
the movable body apparatus according to claim 23 that drives the movable body within a predetermined plane.

28. The pattern forming apparatus according to claim 27, wherein
the object has a sensitive layer, and
the pattern generating device forms the pattern by irradiating the sensitive layer with an energy beam.

29. A device manufacturing method, comprising:
a process of forming a pattern on an object by using the pattern forming apparatus according to claim 27; and
a process of applying processing to the object on which the pattern has been formed.

30. A position measuring system that measures positional information of a movable body that moves along a predetermined plane including a first axis and a second axis that are orthogonal to each other, the system comprising:
a first measurement device which measures positional information of the movable body in a direction parallel to the first axis, by irradiating a first moving grating that is comprised in an optical member attached to the movable body, with a first measurement beam along an optical path that at least partially includes a first optical path parallel to the first axis, irradiating a first fixed grating that is arranged external to the movable body so as to extend in the direction parallel to the first axis and has its periodic direction in the direction parallel to the first axis, with a diffraction beam generated from the first moving grating, and receiving a diffraction beam generated from the first fixed grating via the optical member; and
a second measurement device which measures positional information of the movable body in a direction parallel to the second axis, by irradiating a second moving grating that is comprised in the optical member, with a second measurement beam along an optical path that at least partially includes a second optical path close to the first optical path and parallel to the first axis, irradiating a second fixed grating that is arranged external to the movable body so as to extend in the direction parallel to the first axis and has its periodic direction in the direction parallel to the second axis, with a diffraction beam generated from the second moving grating, and receiving a diffraction beam generated from the second fixed grating via the optical member.

31. The position measuring system according to claim 30, wherein the optical member has its longitudinal direction in the direction parallel to the second axis, and has a length in the longitudinal direction that is longer than or equal to about a length of the movable body in the direction parallel to the second axis.

32. The position measuring system according to claim 30, wherein
the first and second moving gratings have their periodic directions in directions that correspond to the periodic directions of the first and second fixed gratings, respectively.

33. The position measuring system according to claim 30, wherein
the optical member further has a third moving grating and a fourth moving grating that converge diffraction beams generated from the first and second moving gratings, respectively, and
the third and fourth moving gratings have their periodic directions in directions that correspond to the periodic directions of the first and second fixed gratings, respectively.

34. The position measuring system according to claim 30, wherein
the optical member further has a third moving grating and a fourth moving grating that converge diffraction beams generated from the first and second fixed gratings, respectively, and
the third and fourth moving gratings have their periodic directions in directions that correspond to the periodic directions of the first and second fixed gratings, respectively.

35. The position measuring system according to claim 30, wherein
the optical member has a reflection member that deflects the optical paths of the first and second measurement beams toward the first and second fixed gratings, respectively.

36. The position measuring system according to claim 30, wherein
the optical member has a reflection member that deflects optical paths of the diffraction beams generated from the first and second fixed gratings into directions parallel to the first and second optical paths, respectively.

37. The position measuring system according to claim 30, wherein
the first and second optical paths are placed a predetermined distance apart in the direction parallel to the second axis.

38. The position measuring system according to claim 37, wherein
the first and second fixed gratings are placed the predetermined distance apart in the direction parallel to the second axis, on a surface that is opposed to the movable body and parallel to the predetermined plane.

39. The position measuring system according to claim 30, wherein
the first and second fixed gratings each have a length that is longer than or equal to about a movement stroke of the movable body in the direction parallel to the first axis.

40. A movable body apparatus, comprising:
a movable body that moves along a predetermined plane including a first axis and a second axis that are orthogonal to each other;
the position measuring system according to claim 30 that measures positional information of the movable body within the predetermined plane; and
a drive device that drives the movable body along the predetermined plane based on the positional information of the movable body that has been measured by the position measuring system.

41. The movable body apparatus according to claim 40, wherein
the optical member that constitutes a part of the position measuring system is attached near a center of gravity of the movable body.

42. The movable body apparatus according to claim 40, wherein
the position measuring system further comprises
a third measurement device which measures positional information of the movable body in the direction parallel to the first axis, by irradiating the first moving grating, with a third measurement beam along an optical path that at least partially includes a third optical path close to the first optical path and parallel to the first axis, irradiating a third fixed grating that is arranged external to the movable body so as to extend in the direction parallel to the first axis and has its periodic direction in the direction parallel to the first axis, with a diffraction beam generated from the first moving grating, and receiving a diffraction beam generated from the third fixed grating via the optical member.

43. The movable body apparatus according to claim 42, wherein
the first and third optical paths are placed an equal distance apart from the second optical path, on one side and the other side in the direction parallel to the second axis, respectively.

44. An exposure apparatus that forms a pattern on an object by irradiating the object with an energy beam, the apparatus comprising:
the movable body apparatus according to claim 40 that drives a movable body that holds the object along a predetermined plane in order to form the pattern.

45. A device manufacturing method, comprising:
a process of forming a pattern on an object by using the exposure apparatus according to claim 44; and
a process of applying processing to the object on which the pattern has been formed.

46. A pattern forming apparatus that forms a pattern on an object, the apparatus comprising:
a movable body that can move while holding the object;
a pattern generating device that forms the pattern on the object; and
the movable body apparatus according to claim 40 that drives the movable body within a predetermined plane.

47. The pattern forming apparatus according to claim 46, wherein
the object has a sensitive layer, and
the pattern generating device forms the pattern by irradiating the sensitive layer with an energy beam.

48. A device manufacturing method, comprising:
a process of forming a pattern on an object by using the pattern forming apparatus according to claim 46; and
a process of applying processing to the object on which the pattern has been formed.

49. A position measuring method of measuring positional information of a movable body that moves along a predetermined plane including a first axis and a second axis that are orthogonal to each other, the method comprising:
a first measurement process of measuring positional information of the movable body in a direction parallel to the first axis, by irradiating a first moving grating that is comprised in an optical member attached to the movable body and has its periodic direction in a direction corresponding to a periodic direction of a first fixed grating, with a first measurement beam along an optical path parallel to the first axis, irradiating the first fixed grating that is arranged external to the movable body so as to extend in the direction parallel to the first axis and has its periodic direction in the direction parallel to the first axis, with a diffraction beam generated from the first moving grating, and receiving a diffraction beam generated from the first fixed grating, with a first photodetection system via the optical member; and a second measurement process of measuring positional information of the movable body in a direction parallel to the second axis, by irradiating a second moving grating that is comprised in the optical member and has its periodic direction in a direction corresponding to a periodic direction of a second fixed grating, with a second measurement beam along an optical path parallel to the first axis, irradiating the second fixed grating that is arranged external to the movable body so as to extend in the direction parallel to the first axis and has its periodic direction in the direction parallel to the second axis, with a diffraction beam generated from the second moving grating, and receiving a diffraction beam generated from the second fixed grating, with a second photodetection system via the optical member.

50. The position measuring method according to claim 49, wherein
the optical member has its longitudinal direction in the direction parallel to the second axis, and has a length in the longitudinal direction that is longer than or equal to about a length of the movable body in the direction parallel to the second axis.

51. The position measuring method according to claim 49, wherein
the first and second moving gratings are placed on a surface of the optical member.

52. A movable body drive method, comprising:
a process of measuring positional information of a movable body within a predetermined plane including a first axis and a second axis that are orthogonal to each other by using the position measuring method according to claim 49, the movable body moving along the predetermined plane; and
a process of driving the movable body along the predetermined plane based on the positional information of the movable body that has been measured.

53. An exposure method of forming a pattern on an object by irradiating the object with an energy beam, the method comprising:
driving a movable body that holds the object along a predetermined plane by using the movable body drive method according to claim 52 in order to form the pattern.

54. A device manufacturing method, comprising:
a process of forming a pattern on an object by using the exposure method according to claim 53; and
a process of applying processing to the object on which the pattern has been formed.

55. A position measuring method of measuring positional information of a movable body that moves along a predetermined plane including a first axis and a second axis that are orthogonal to each other, the method comprising:
a first measurement process of measuring positional information of the movable body in a direction parallel to the first axis, by irradiating a first diffraction grating that is arranged on the movable body and has its periodic direction in a direction corresponding to a periodic direction of a first reference grating, with a first measurement beam along an optical path parallel to the first axis, irradiating the first reference grating that is arranged external to the movable body so as to extend in the direction parallel to the first axis and has its periodic direction in the direction parallel to the first axis, with a diffraction beam generated from the first diffraction grating, and receiving a diffraction beam generated from the first reference grating, with a first photodetection system; and a second measurement process of measuring positional information of the movable body in a direction parallel to the second axis, by irradiating a second reference grating that is arranged on the movable body and has its periodic direction in a direction parallel to the second axis, with a second measurement beam along an optical path parallel to the first axis, irradiating a second diffraction grating that is arranged external to the movable body so as to extend in the direction parallel to the first axis and has its periodic direction in a direction corresponding to the periodic direction of the second reference grating, with a diffraction beam generated from the second reference grating, and receiving a diffraction beam generated from the second diffraction grating, with a second photodetection system.

56. The position measuring method according to claim 55, wherein
the first diffraction grating and the second reference grating have their longitudinal directions in the direction parallel to the second axis, and each have a length in the longitudinal direction that is longer than or equal to about a length of the movable body in the direction parallel to the second axis.

57. The position measuring method according to claim 55, wherein
the first reference grating and the second diffraction grating are placed on a surface that is opposed to the movable body and parallel to the predetermined plane.

58. A movable body drive method, comprising:
a process of measuring positional information of a movable body within a predetermined plane including a first axis and a second axis that are orthogonal to each other by using the position measuring method according to claim 55, the movable body moving along the predetermined plane; and
a process of driving the movable body along the predetermined plane based on the positional information of the movable body that has been measured.

59. An exposure method of forming a pattern on an object by irradiating the object with an energy beam, the method comprising:
driving a movable body that holds the object along a predetermined plane by using the movable body drive method according to claim 58 in order to form the pattern.

60. A device manufacturing method, comprising:
a process of forming a pattern on an object by using the exposure method according to claim 59; and
a process of applying processing to the object on which the pattern has been formed.

61. A position measuring method of measuring positional information of a movable body that moves along a predetermined plane including a first axis and a second axis that are orthogonal to each other, the method comprising:
a first measurement process of measuring positional information of the movable body in a direction parallel to the first axis, by irradiating a first moving grating that is comprised in an optical member attached to the movable body, with a first measurement beam along an optical path that at least partially includes a first optical path parallel to the first axis, irradiating a first fixed grating that is arranged external to the movable body so as to extend in a direction parallel to the first axis and has its periodic direction in the direction parallel to the first axis, with a diffraction beam generated from the first moving grating, and receiving a diffraction beam generated from the first fixed grating via the optical member; and a second measurement process of measuring positional information of the movable body in a direction parallel to the second axis, by irradiating a second moving grating that is comprised in the optical member, with a second measurement beam along an optical path that at least partially includes a second optical path close to the first optical path and parallel to the first axis, irradiating a second fixed grating that is arranged external to the movable body so as to extend in the direction parallel to the first axis and has its periodic direction in the direction parallel to the second axis, with a diffraction beam generated from the second moving grating, and receiving a diffraction beam generated from the second fixed grating via the optical member.

62. The position measuring method according to claim 61, wherein the optical member has a reflection member that deflects the optical paths of the first and second measurement beams toward the first and second fixed gratings, respectively.

63. The position measuring method according to claim 61, wherein the optical member has a reflection member that deflects optical paths of the diffraction beams generated from the first and second fixed gratings into directions parallel to the first and second optical paths, respectively.

64. A movable body drive method, comprising:

a process of measuring positional information of a movable body within a predetermined plane including a first axis and a second axis that are orthogonal to each other by using the position measuring method according to claim 61, the movable body moving along the predetermined plane; and a process of driving the movable body along the predetermined plane based on the positional information of the movable body that has been measured.

65. An exposure method of forming a pattern on an object by irradiating the object with an energy beam, the method comprising:

driving a movable body that holds the object along a predetermined plane by using the movable body drive method according to claim 64 in order to form the pattern.

66. A device manufacturing method, comprising:

a process of forming a pattern on an object by using the exposure method according to claim 65; and a process of applying processing to the object on which the pattern has been formed.

* * * * *